(12) United States Patent
Lee et al.

(10) Patent No.: US 9,134,527 B2
(45) Date of Patent: Sep. 15, 2015

(54) PIXEL VIA AND METHODS OF FORMING THE SAME

(75) Inventors: Hojin Lee, Seoul (KR); Fan Zhong, Fremont, CA (US); Yi Tao, San Jose, CA (US)

(73) Assignee: QUALCOMM MEMS TECHNOLOGIES, INC., San Diego, CA (US)

( * ) Notice: Subject to any disclaimer, the term of this patent is extended or adjusted under 35 U.S.C. 154(b) by 400 days.

(21) Appl. No.: 13/079,599

(22) Filed: Apr. 4, 2011

(65) Prior Publication Data

US 2012/0249558 A1    Oct. 4, 2012

(51) Int. Cl.
*G02B 26/00* (2006.01)
*B81B 7/00* (2006.01)

(52) U.S. Cl.
CPC ............ *G02B 26/001* (2013.01); *B81B 7/0006* (2013.01); *B81B 2201/047* (2013.01); *Y10T 29/49002* (2015.01)

(58) Field of Classification Search
USPC ............... 359/290, 291; 345/85, 108; 438/29; 257/91
See application file for complete search history.

(56) References Cited

U.S. PATENT DOCUMENTS

| | | |
|---|---|---|
| 2,534,846 A | 12/1950 | Ambrose et al. |
| 2,590,906 A | 4/1952 | Tripp |
| 2,677,714 A | 5/1954 | Auwarter |
| 3,037,189 A | 5/1962 | Barrett et al. |
| 3,210,757 A | 10/1965 | Jacob |
| 3,247,392 A | 4/1966 | Thelen |
| 3,296,530 A | 1/1967 | Brooks |
| 3,439,973 A | 4/1969 | Bernt et al. |
| 3,443,854 A | 5/1969 | Herbert |
| 3,653,741 A | 4/1972 | Marks |
| 3,656,836 A | 4/1972 | Baudoin et al. |
| 3,679,313 A | 7/1972 | Rosenberg |
| 3,701,586 A | 10/1972 | Goetz |

(Continued)

FOREIGN PATENT DOCUMENTS

| | | |
|---|---|---|
| CN | 1673800 A | 9/2005 |
| CN | 101388325 A | 3/2009 |

(Continued)

OTHER PUBLICATIONS

Billard, Tunable Capacitor, 5th Annual Review of LETI, Jun. 24, 2003, p. 7.

(Continued)

*Primary Examiner* — Mahidere Sahle
(74) *Attorney, Agent, or Firm* — Knobbe, Martens, Olson & Bear LLP

(57) ABSTRACT

This disclosure provides systems, methods and apparatuses for pixel vias. In one aspect, a method of forming an electromechanical device having a plurality of pixels includes depositing an electrically conductive black mask on a substrate at each of four corners and along at least one edge region of each pixel, depositing a dielectric layer over the black mask, depositing an optical stack including a stationary electrode over the dielectric layer, and depositing a mechanical layer over the optical stack. The method further includes providing a conductive via in a first pixel of the plurality of pixels, the via disposed in the dielectric layer and electrically connecting the stationary electrode to the black mask, the via disposed in a position along an edge of the first pixel, spaced offset from the edge of the first pixel in a direction towards the center of the first pixel.

28 Claims, 29 Drawing Sheets

(56) References Cited

U.S. PATENT DOCUMENTS

| | | |
|---|---|---|
| 3,728,030 A | 4/1973 | Hawes |
| 3,813,265 A | 5/1974 | Marks |
| 3,886,310 A | 5/1975 | Guldberg |
| 3,955,190 A | 5/1976 | Teraishi |
| 3,955,880 A | 5/1976 | Lierke |
| 4,099,854 A | 7/1978 | Decker et al. |
| 4,196,396 A | 4/1980 | Smith |
| 4,228,437 A | 10/1980 | Shelton |
| 4,377,324 A | 3/1983 | Durand et al. |
| 4,389,096 A | 6/1983 | Hori et al. |
| 4,392,711 A | 7/1983 | Moraw et al. |
| 4,403,248 A | 9/1983 | te Velde |
| 4,421,381 A | 12/1983 | Ueda et al. |
| 4,425,572 A | 1/1984 | Takafuji et al. |
| 4,441,789 A | 4/1984 | Pohlack |
| 4,441,791 A | 4/1984 | Hornbeck |
| 4,445,050 A | 4/1984 | Marks |
| 4,459,182 A | 7/1984 | Te Velde |
| 4,482,213 A | 11/1984 | Piliavin et al. |
| 4,497,974 A | 2/1985 | Deckman et al. |
| 4,498,953 A | 2/1985 | Cook et al. |
| 4,500,171 A | 2/1985 | Penz et al. |
| 4,518,959 A | 5/1985 | Ueda et al. |
| 4,519,676 A | 5/1985 | Te Velde |
| 4,531,126 A | 7/1985 | Sadones |
| 4,560,435 A | 12/1985 | Brown et al. |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,626,840 A | 12/1986 | Glasper et al. |
| 4,655,554 A | 4/1987 | Armitage |
| 4,662,746 A | 5/1987 | Hornbeck |
| 4,663,083 A | 5/1987 | Marks |
| 4,663,181 A | 5/1987 | Murali |
| 4,666,254 A | 5/1987 | Itoh et al. |
| 4,672,254 A | 6/1987 | Dolat et al. |
| 4,681,403 A | 7/1987 | Te Velde et al. |
| 4,705,361 A | 11/1987 | Frazier et al. |
| 4,710,732 A | 12/1987 | Hornbeck |
| 4,748,366 A | 5/1988 | Taylor |
| 4,779,959 A | 10/1988 | Saunders |
| 4,786,128 A | 11/1988 | Birnbach |
| 4,790,635 A | 12/1988 | Apsley |
| 4,822,993 A | 4/1989 | Dillon et al. |
| 4,856,863 A | 8/1989 | Sampsell et al. |
| 4,857,978 A | 8/1989 | Goldburt et al. |
| 4,859,060 A | 8/1989 | Katagiri et al. |
| 4,864,290 A | 9/1989 | Waters |
| 4,880,493 A | 11/1989 | Ashby et al. |
| 4,895,500 A | 1/1990 | Hok et al. |
| 4,896,033 A | 1/1990 | Gautier |
| 4,900,136 A | 2/1990 | Goldburt et al. |
| 4,900,395 A | 2/1990 | Syverson et al. |
| 4,925,259 A | 5/1990 | Emmett |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,973,131 A | 11/1990 | Carnes |
| 4,980,775 A | 12/1990 | Brody |
| 4,982,184 A | 1/1991 | Kirkwood |
| 5,014,259 A | 5/1991 | Goldberg et al. |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,062,689 A | 11/1991 | Koehler |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,091,983 A | 2/1992 | Lukosz |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,170,283 A | 12/1992 | O'Brien et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,206,632 A | 4/1993 | Dupont et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,285,196 A | 2/1994 | Gale |
| 5,287,096 A | 2/1994 | Thompson et al. |
| 5,293,272 A | 3/1994 | Jannson et al. |
| 5,296,950 A | 3/1994 | Lin et al. |
| 5,305,640 A | 4/1994 | Boysel et al. |
| 5,311,360 A | 5/1994 | Bloom et al. |
| 5,312,513 A | 5/1994 | Florence et al. |
| 5,315,370 A | 5/1994 | Bulow |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,331,454 A | 7/1994 | Hornbeck |
| 5,339,116 A | 8/1994 | Urbanus et al. |
| 5,345,328 A | 9/1994 | Fritz et al. |
| 5,355,357 A | 10/1994 | Yamamori et al. |
| 5,358,601 A | 10/1994 | Cathey |
| 5,365,283 A | 11/1994 | Doherty et al. |
| 5,367,878 A | 11/1994 | Muntz et al. |
| 5,374,346 A | 12/1994 | Bladon et al. |
| 5,381,232 A | 1/1995 | Van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,452,138 A | 9/1995 | Mignardi et al. |
| 5,454,904 A | 10/1995 | Ghezzo et al. |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,471,341 A | 11/1995 | Warde et al. |
| 5,474,865 A | 12/1995 | Vasudev |
| 5,485,304 A | 1/1996 | Kaeriyama |
| 5,489,952 A | 2/1996 | Gove et al. |
| 5,497,172 A | 3/1996 | Doherty et al. |
| 5,497,197 A | 3/1996 | Gove et al. |
| 5,497,262 A | 3/1996 | Kaeriyama |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |

(56) References Cited

U.S. PATENT DOCUMENTS

| | | |
|---|---|---|
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,526,951 A | 6/1996 | Bailey et al. |
| 5,528,707 A | 6/1996 | Sullivan et al. |
| 5,535,047 A | 7/1996 | Hornbeck |
| 5,544,268 A | 8/1996 | Bischel et al. |
| 5,548,301 A | 8/1996 | Kornher et al. |
| 5,550,373 A | 8/1996 | Cole et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,561,523 A | 10/1996 | Blomberg et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,614,937 A | 3/1997 | Nelson |
| 5,619,059 A | 4/1997 | Li et al. |
| 5,619,061 A | 4/1997 | Goldsmith et al. |
| 5,619,365 A | 4/1997 | Rhoads et al. |
| 5,619,366 A | 4/1997 | Rhoads et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |
| 5,646,729 A | 7/1997 | Koskinen et al. |
| 5,646,768 A | 7/1997 | Kaeriyama |
| 5,650,881 A | 7/1997 | Hornbeck |
| 5,654,741 A | 8/1997 | Sampsell et al. |
| 5,657,099 A | 8/1997 | Doherty et al. |
| 5,659,374 A | 8/1997 | Gale, Jr. et al. |
| 5,661,591 A | 8/1997 | Lin et al. |
| 5,661,592 A | 8/1997 | Bornstein et al. |
| 5,665,997 A | 9/1997 | Weaver et al. |
| 5,673,139 A | 9/1997 | Johnson |
| 5,673,785 A | 10/1997 | Schlaak et al. |
| 5,677,783 A | 10/1997 | Bloom et al. |
| 5,683,591 A | 11/1997 | Offenberg |
| 5,686,979 A | 11/1997 | Weber et al. |
| 5,699,074 A | 12/1997 | Sutherland et al. |
| 5,699,181 A | 12/1997 | Choi |
| 5,703,710 A | 12/1997 | Brinkman et al. |
| 5,710,656 A | 1/1998 | Goossen |
| 5,719,068 A | 2/1998 | Suzawa et al. |
| 5,726,480 A | 3/1998 | Pister |
| 5,734,177 A | 3/1998 | Sakamoto |
| 5,739,945 A | 4/1998 | Tayebati |
| 5,740,150 A | 4/1998 | Uchimaru et al. |
| 5,745,193 A | 4/1998 | Urbanus et al. |
| 5,745,281 A | 4/1998 | Yi et al. |
| 5,751,469 A | 5/1998 | Arney et al. |
| 5,771,116 A | 6/1998 | Miller et al. |
| 5,771,321 A | 6/1998 | Stern |
| 5,784,190 A | 7/1998 | Worley |
| 5,784,212 A | 7/1998 | Hornbeck |
| 5,786,927 A | 7/1998 | Greywall et al. |
| 5,793,504 A | 8/1998 | Stoll |
| 5,795,208 A | 8/1998 | Hattori |
| 5,808,780 A | 9/1998 | McDonald |
| 5,808,781 A | 9/1998 | Arney et al. |
| 5,815,141 A | 9/1998 | Phares |
| 5,818,095 A | 10/1998 | Sampsell |
| 5,825,528 A | 10/1998 | Goossen |
| 5,835,255 A | 11/1998 | Miles |
| 5,838,484 A | 11/1998 | Goossen et al. |
| 5,842,088 A | 11/1998 | Thompson |
| 5,867,302 A | 2/1999 | Fleming |
| 5,870,221 A | 2/1999 | Goossen |
| 5,880,921 A | 3/1999 | Tham et al. |
| 5,881,449 A | 3/1999 | Ghosh et al. |
| 5,905,482 A | 5/1999 | Hughes et al. |
| 5,912,758 A | 6/1999 | Knipe et al. |
| 5,914,804 A | 6/1999 | Goossen |
| 5,920,418 A | 7/1999 | Shiono et al. |
| 5,933,183 A | 8/1999 | Enomoto et al. |
| 5,943,158 A | 8/1999 | Ford et al. |
| 5,949,571 A | 9/1999 | Goossen et al. |
| 5,959,763 A | 9/1999 | Bozler et al. |
| 5,961,848 A | 10/1999 | Jacquet et al. |
| 5,963,788 A | 10/1999 | Barron et al. |
| 5,986,796 A | 11/1999 | Miles |
| 5,994,174 A | 11/1999 | Carey et al. |
| 6,002,661 A | 12/1999 | Abe et al. |
| 6,028,689 A | 2/2000 | Michalicek et al. |
| 6,028,690 A | 2/2000 | Carter et al. |
| 6,031,653 A | 2/2000 | Wang |
| 6,038,056 A | 3/2000 | Florence et al. |
| 6,040,937 A | 3/2000 | Miles |
| 6,046,659 A | 4/2000 | Loo et al. |
| 6,046,840 A | 4/2000 | Huibers |
| 6,049,317 A | 4/2000 | Thompson et al. |
| 6,055,090 A | 4/2000 | Miles |
| 6,056,406 A | 5/2000 | Park |
| 6,061,075 A | 5/2000 | Nelson et al. |
| 6,065,424 A | 5/2000 | Shacham-Diamand et al. |
| 6,097,145 A | 8/2000 | Kastalsky et al. |
| 6,099,132 A | 8/2000 | Kaeriyama |
| 6,100,477 A | 8/2000 | Randall et al. |
| 6,100,861 A | 8/2000 | Cohen et al. |
| 6,100,872 A | 8/2000 | Aratani et al. |
| 6,113,239 A | 9/2000 | Sampsell et al. |
| 6,115,014 A | 9/2000 | Aoki et al. |
| 6,124,851 A | 9/2000 | Jacobsen |
| 6,142,358 A | 11/2000 | Cohn et al. |
| 6,147,680 A | 11/2000 | Tareev |
| 6,147,790 A | 11/2000 | Meier et al. |
| 6,154,586 A | 11/2000 | MacDonald et al. |
| 6,158,156 A | 12/2000 | Patrick |
| 6,160,833 A | 12/2000 | Floyd et al. |
| 6,171,945 B1 | 1/2001 | Mandal et al. |
| 6,172,797 B1 | 1/2001 | Huibers |
| 6,180,428 B1 | 1/2001 | Peeters et al. |
| 6,195,196 B1 | 2/2001 | Kimura et al. |
| 6,201,633 B1 | 3/2001 | Peeters et al. |
| 6,215,221 B1 | 4/2001 | Cabuz et al. |
| 6,219,015 B1 | 4/2001 | Bloom et al. |
| 6,232,936 B1 | 5/2001 | Gove et al. |
| 6,239,777 B1 | 5/2001 | Sugahara et al. |
| 6,242,932 B1 | 6/2001 | Hembree |
| 6,243,149 B1 | 6/2001 | Swanson et al. |
| 6,262,697 B1 | 7/2001 | Stephenson |
| 6,282,010 B1 | 8/2001 | Sulzbach et al. |
| 6,285,424 B1 | 9/2001 | Yoshida |
| 6,288,472 B1 | 9/2001 | Cabuz et al. |
| 6,288,824 B1 | 9/2001 | Kastalsky |
| 6,295,154 B1 | 9/2001 | Laor et al. |
| 6,297,811 B1 | 10/2001 | Kent et al. |
| 6,301,000 B1 | 10/2001 | Johnson |
| 6,316,289 B1 | 11/2001 | Chung |
| 6,323,923 B1 | 11/2001 | Hoshino et al. |
| 6,323,982 B1 | 11/2001 | Hornbeck |
| 6,323,987 B1 | 11/2001 | Rinaudo et al. |
| 6,327,071 B1 | 12/2001 | Kimura |

(56) References Cited

U.S. PATENT DOCUMENTS

| | | |
|---|---|---|
| 6,331,909 B1 | 12/2001 | Dunfield |
| 6,335,235 B1 | 1/2002 | Bhekta et al. |
| 6,335,831 B2 | 1/2002 | Kowarz et al. |
| 6,339,417 B1 | 1/2002 | Quanrud |
| 6,351,329 B1 | 2/2002 | Greywall |
| 6,353,489 B1 | 3/2002 | Popovich et al. |
| 6,356,254 B1 | 3/2002 | Kimura |
| 6,356,378 B1 | 3/2002 | Huibers |
| 6,358,021 B1 | 3/2002 | Cabuz |
| 6,376,787 B1 | 4/2002 | Martin et al. |
| 6,377,233 B2 | 4/2002 | Colgan et al. |
| 6,381,022 B1 | 4/2002 | Zavracky |
| 6,384,952 B1 | 5/2002 | Clark et al. |
| 6,400,738 B1 | 6/2002 | Tucker et al. |
| 6,407,851 B1 | 6/2002 | Islam et al. |
| 6,417,868 B1 | 7/2002 | Bock et al. |
| 6,433,917 B1 | 8/2002 | Mei et al. |
| 6,437,583 B1 | 8/2002 | Tartagni et al. |
| 6,438,282 B1 | 8/2002 | Takeda et al. |
| 6,447,126 B1 | 9/2002 | Hornbeck |
| 6,449,084 B1 | 9/2002 | Guo |
| 6,452,712 B2 | 9/2002 | Atobe et al. |
| 6,456,420 B1 | 9/2002 | Goodwin-Johansson |
| 6,465,355 B1 | 10/2002 | Horsley |
| 6,466,190 B1 | 10/2002 | Evoy |
| 6,466,354 B1 | 10/2002 | Gudeman |
| 6,466,358 B2 | 10/2002 | Tew |
| 6,473,072 B1 | 10/2002 | Comiskey et al. |
| 6,473,274 B1 | 10/2002 | Maimone et al. |
| 6,480,177 B2 | 11/2002 | Doherty et al. |
| 6,496,122 B2 | 12/2002 | Sampsell |
| 6,519,073 B1 | 2/2003 | Goossen |
| 6,535,663 B1 | 3/2003 | Chertkow |
| 6,545,335 B1 | 4/2003 | Chua et al. |
| 6,548,908 B2 | 4/2003 | Chua et al. |
| 6,549,338 B1 | 4/2003 | Wolverton et al. |
| 6,552,840 B2 | 4/2003 | Knipe |
| 6,556,338 B2 | 4/2003 | Han et al. |
| 6,574,033 B1 | 6/2003 | Chui et al. |
| 6,589,625 B1 | 7/2003 | Kothari et al. |
| 6,597,490 B2 | 7/2003 | Tayebati |
| 6,600,201 B2 | 7/2003 | Hartwell et al. |
| 6,606,175 B1 | 8/2003 | Sampsell et al. |
| 6,608,268 B1 | 8/2003 | Goldsmith |
| 6,624,944 B1 | 9/2003 | Wallace et al. |
| 6,625,047 B2 | 9/2003 | Coleman, Jr. |
| 6,630,786 B2 | 10/2003 | Cummings et al. |
| 6,632,698 B2 | 10/2003 | Ives |
| 6,635,919 B1 | 10/2003 | Melendez et al. |
| 6,643,069 B2 | 11/2003 | Dewald |
| 6,650,455 B2 | 11/2003 | Miles |
| 6,657,832 B2 | 12/2003 | Williams et al. |
| 6,660,656 B2 | 12/2003 | Cheung et al. |
| 6,661,561 B2 | 12/2003 | Fitzpatrick et al. |
| 6,666,561 B1 | 12/2003 | Blakley |
| 6,674,090 B1 | 1/2004 | Chua et al. |
| 6,674,562 B1 | 1/2004 | Miles et al. |
| 6,680,792 B2 | 1/2004 | Miles |
| 6,698,295 B1 | 3/2004 | Sherrer |
| 6,707,594 B2 | 3/2004 | Holmes |
| 6,710,908 B2 | 3/2004 | Miles et al. |
| 6,738,194 B1 | 5/2004 | Ramirez et al. |
| 6,741,377 B2 | 5/2004 | Miles |
| 6,741,383 B2 | 5/2004 | Huibers et al. |
| 6,741,384 B1 | 5/2004 | Martin et al. |
| 6,741,503 B1 | 5/2004 | Farris et al. |
| 6,747,785 B2 | 6/2004 | Chen et al. |
| 6,747,800 B1 | 6/2004 | Lin |
| 6,768,555 B2 | 7/2004 | Chen |
| 6,775,174 B2 | 8/2004 | Huffman et al. |
| 6,778,155 B2 | 8/2004 | Doherty et al. |
| 6,787,438 B1 | 9/2004 | Nelson |
| 6,794,119 B2 | 9/2004 | Miles |
| 6,806,557 B2 | 10/2004 | Ding |
| 6,807,892 B2 | 10/2004 | Biegelsen et al. |
| 6,809,788 B2 | 10/2004 | Yamada et al. |
| 6,811,267 B1 | 11/2004 | Allen et al. |
| 6,813,059 B2 | 11/2004 | Hunter et al. |
| 6,813,060 B1 | 11/2004 | Garcia et al. |
| 6,819,469 B1 | 11/2004 | Koba |
| 6,822,304 B1 | 11/2004 | Honer |
| 6,822,628 B2 | 11/2004 | Dunphy et al. |
| 6,822,780 B1 | 11/2004 | Long, Jr. |
| 6,829,132 B2 | 12/2004 | Martin et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,861,277 B1 | 3/2005 | Monroe et al. |
| 6,862,022 B2 | 3/2005 | Slupe |
| 6,862,029 B1 | 3/2005 | D'souza et al. |
| 6,862,127 B1 | 3/2005 | Ishii |
| 6,864,882 B2 | 3/2005 | Newton |
| 6,867,896 B2 | 3/2005 | Miles |
| 6,870,581 B2 | 3/2005 | Li et al. |
| 6,870,654 B2 | 3/2005 | Lin et al. |
| 6,876,047 B2 | 4/2005 | Cunningham et al. |
| 6,876,482 B2 | 4/2005 | DeReus |
| 6,881,535 B2 | 4/2005 | Yamaguchi |
| 6,882,458 B2 | 4/2005 | Lin et al. |
| 6,882,461 B1 | 4/2005 | Tsai et al. |
| 6,891,658 B2 | 5/2005 | Whitehead et al. |
| 6,912,022 B2 | 6/2005 | Lin et al. |
| 6,913,942 B2 | 7/2005 | Patel et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,959,990 B2 | 11/2005 | Penn |
| 6,960,305 B2 | 11/2005 | Doan et al. |
| 6,980,350 B2 | 12/2005 | Hung et al. |
| 6,982,820 B2 | 1/2006 | Tsai |
| 6,999,225 B2 | 2/2006 | Lin et al. |
| 7,002,441 B2 | 2/2006 | Pillans et al. |
| 7,002,726 B2 | 2/2006 | Patel et al. |
| 7,006,272 B2 | 2/2006 | Tsai |
| 7,008,812 B1 | 3/2006 | Carley |
| 7,009,754 B2 | 3/2006 | Huibers |
| 7,015,624 B1 | 3/2006 | Su et al. |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,053,737 B2 | 5/2006 | Schwartz et al. |
| 7,072,093 B2 | 7/2006 | Piehl et al. |
| 7,075,700 B2 | 7/2006 | Muenter |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,126,741 B2 | 10/2006 | Wagner et al. |
| 7,130,104 B2 | 10/2006 | Cummings |
| 7,161,728 B2 | 1/2007 | Sampsell et al. |
| 7,184,195 B2 | 2/2007 | Yang |
| 7,184,202 B2 | 2/2007 | Miles et al. |
| 7,198,973 B2 | 4/2007 | Lin et al. |
| 7,205,722 B2 | 4/2007 | Koshio et al. |
| 7,221,495 B2 | 5/2007 | Miles et al. |
| 7,235,914 B2 | 6/2007 | Richards et al. |
| 7,236,284 B2 | 6/2007 | Miles |
| 7,245,285 B2 | 7/2007 | Yeh et al. |
| 7,250,930 B2 | 7/2007 | Hoffman et al. |
| 7,289,259 B2 | 10/2007 | Chui et al. |
| 7,301,704 B2 | 11/2007 | Miles |
| 7,302,157 B2 | 11/2007 | Chui |
| 7,304,784 B2 | 12/2007 | Chui et al. |
| 7,321,456 B2 | 1/2008 | Cummings |
| 7,321,457 B2 | 1/2008 | Heald |
| 7,327,510 B2 | 2/2008 | Cummings et al. |
| 7,329,917 B2 | 2/2008 | Patraw et al. |
| 7,372,613 B2 | 5/2008 | Chui et al. |
| 7,372,619 B2 | 5/2008 | Miles |

(56) References Cited

U.S. PATENT DOCUMENTS

| | | |
|---|---|---|
| 7,373,026 B2 | 5/2008 | Chui |
| 7,375,465 B2 | 5/2008 | Chen |
| 7,385,744 B2 | 6/2008 | Kogut et al. |
| 7,385,762 B2 | 6/2008 | Cummings |
| 7,400,488 B2 | 7/2008 | Lynch et al. |
| 7,405,852 B2 | 7/2008 | Brosnihan et al. |
| 7,405,863 B2 | 7/2008 | Tung et al. |
| 7,417,746 B2 | 8/2008 | Lin et al. |
| 7,420,725 B2 | 9/2008 | Kothari |
| 7,436,573 B2 | 10/2008 | Doan et al. |
| 7,439,943 B2 | 10/2008 | Nakanishi |
| 7,459,402 B2 | 12/2008 | Doan et al. |
| 7,460,291 B2 | 12/2008 | Sampsell et al. |
| 7,460,292 B2 | 12/2008 | Chou |
| 7,471,442 B2 | 12/2008 | Sampsell |
| 7,476,327 B2 | 1/2009 | Tung et al. |
| 7,477,440 B1 | 1/2009 | Huang et al. |
| 7,479,785 B2 | 1/2009 | Liu et al. |
| 7,492,503 B2 | 2/2009 | Chui |
| 7,508,566 B2 | 3/2009 | Feenstra et al. |
| 7,515,327 B2 | 4/2009 | Cummings |
| 7,527,995 B2 | 5/2009 | Sampsell |
| 7,527,998 B2 | 5/2009 | Tung et al. |
| 7,532,377 B2 | 5/2009 | Miles |
| 7,532,381 B2 | 5/2009 | Miles et al. |
| 7,535,621 B2 | 5/2009 | Chiang |
| 7,542,198 B2 | 6/2009 | Kothari |
| 7,545,552 B2 | 6/2009 | U'ren |
| 7,550,794 B2 | 6/2009 | Miles et al. |
| 7,550,810 B2 | 6/2009 | Mignard et al. |
| 7,554,711 B2 | 6/2009 | Miles |
| 7,554,714 B2 | 6/2009 | Chui et al. |
| 7,561,321 B2 | 7/2009 | Heald |
| 7,564,612 B2 | 7/2009 | Chui |
| 7,564,613 B2 | 7/2009 | Sasagawa et al. |
| 7,566,664 B2 | 7/2009 | Yan et al. |
| 7,566,940 B2 | 7/2009 | Sasagawa et al. |
| 7,567,373 B2 | 7/2009 | Chui et al. |
| 7,569,488 B2 | 8/2009 | Rafanan |
| 7,583,350 B2 | 9/2009 | Chang et al. |
| 7,612,932 B2 | 11/2009 | Chui et al. |
| 7,612,933 B2 | 11/2009 | Djordjev |
| 7,623,287 B2 | 11/2009 | Sasagawa et al. |
| 7,629,197 B2 | 12/2009 | Luo et al. |
| 7,630,119 B2 | 12/2009 | Tung et al. |
| 7,630,121 B2 | 12/2009 | Endisch et al. |
| 7,643,199 B2 | 1/2010 | Lan |
| 7,643,202 B2 | 1/2010 | Sasagawa |
| 7,649,671 B2 | 1/2010 | Kothari et al. |
| 7,656,391 B2 | 2/2010 | Kimura et al. |
| 7,660,058 B2 | 2/2010 | Qiu et al. |
| 7,663,794 B2 | 2/2010 | Cummings |
| 7,672,035 B2 | 3/2010 | Sampsell et al. |
| 7,684,104 B2 | 3/2010 | Chui et al. |
| 7,684,106 B2 | 3/2010 | Sampsell |
| 7,692,844 B2 | 4/2010 | Miles |
| 7,704,772 B2 | 4/2010 | Tung et al. |
| 7,715,079 B2 | 5/2010 | Kogut et al. |
| 7,715,085 B2 | 5/2010 | Sasagawa |
| 7,719,500 B2 | 5/2010 | Chui |
| 7,719,747 B2 | 5/2010 | Tung et al. |
| 7,738,157 B2 | 6/2010 | Miles |
| 7,742,220 B2 | 6/2010 | Kogut et al. |
| 7,746,539 B2 | 6/2010 | Sampsell |
| 7,747,109 B2 | 6/2010 | Zhong et al. |
| 7,768,690 B2 | 8/2010 | Sampsell |
| 7,773,286 B2 | 8/2010 | Mignard |
| 7,782,517 B2 | 8/2010 | Griffiths et al. |
| 7,782,523 B2 | 8/2010 | Ishii |
| 7,787,173 B2 | 8/2010 | Chui |
| 7,795,061 B2 | 9/2010 | Wang et al. |
| 7,808,694 B2 | 10/2010 | Miles |
| 7,808,695 B2 | 10/2010 | Sampsell |
| 7,813,029 B2 | 10/2010 | Kothari et al. |
| 7,821,010 B2 | 10/2010 | Pan et al. |
| 7,826,120 B2 | 11/2010 | Miles |
| 7,830,586 B2 | 11/2010 | Miles |
| 7,830,587 B2 | 11/2010 | Miles |
| 7,830,588 B2 | 11/2010 | Miles |
| 7,835,061 B2 | 11/2010 | Kogut et al. |
| 7,839,356 B2 | 11/2010 | Hagood et al. |
| 7,839,557 B2 | 11/2010 | Chui et al. |
| 7,847,999 B2 | 12/2010 | Lee et al. |
| 7,848,003 B2 | 12/2010 | Kothari et al. |
| 7,852,544 B2 | 12/2010 | Sampsell |
| 7,852,545 B2 | 12/2010 | Miles |
| 7,855,826 B2 | 12/2010 | de Groot |
| 7,859,740 B2 | 12/2010 | Tung |
| 7,872,792 B2 | 1/2011 | Miles |
| RE42,119 E | 2/2011 | Chui et al. |
| 7,884,989 B2 | 2/2011 | Gally et al. |
| 7,889,415 B2 | 2/2011 | Kothari |
| 7,889,417 B2 | 2/2011 | Sasagawa |
| 7,893,919 B2 | 2/2011 | Kothari et al. |
| 7,898,722 B2 | 3/2011 | Miles |
| 7,898,723 B2 | 3/2011 | Khazeni et al. |
| 7,898,725 B2 | 3/2011 | Sampsell |
| 7,916,980 B2 | 3/2011 | Lasiter |
| 7,924,494 B2 | 4/2011 | Tung et al. |
| 7,936,497 B2 | 5/2011 | Chui et al. |
| 7,944,599 B2 | 5/2011 | Chui et al. |
| 7,944,604 B2 | 5/2011 | Ganti et al. |
| 7,948,671 B2 | 5/2011 | Tung et al. |
| 7,952,787 B2 | 5/2011 | Tung et al. |
| 7,999,995 B2 | 8/2011 | Hashimura et al. |
| 8,074,752 B2 | 12/2011 | Rudakevych |
| 8,111,262 B2 | 2/2012 | Djordjev et al. |
| 8,319,232 B2 | 11/2012 | Chou |
| 8,344,377 B2 | 1/2013 | Gally et al. |
| 2001/0001080 A1 | 5/2001 | Eldridge et al. |
| 2001/0003487 A1 | 6/2001 | Miles |
| 2001/0028503 A1 | 10/2001 | Flanders et al. |
| 2001/0043171 A1 | 11/2001 | Van Gorkom et al. |
| 2001/0055208 A1 | 12/2001 | Kimura |
| 2002/0014579 A1 | 2/2002 | Dunfield |
| 2002/0021485 A1 | 2/2002 | Pilossof |
| 2002/0027636 A1 | 3/2002 | Yamada |
| 2002/0051281 A1 | 5/2002 | Ueda et al. |
| 2002/0054424 A1 | 5/2002 | Miles |
| 2002/0070931 A1 | 6/2002 | Ishikawa |
| 2002/0075555 A1 | 6/2002 | Miles |
| 2002/0114558 A1 | 8/2002 | Nemirovsky |
| 2002/0126364 A1 | 9/2002 | Miles |
| 2002/0139981 A1 | 10/2002 | Young |
| 2002/0146200 A1 | 10/2002 | Kurdle et al. |
| 2002/0149828 A1 | 10/2002 | Miles |
| 2002/0149834 A1 | 10/2002 | Mei et al. |
| 2002/0149850 A1 | 10/2002 | Heffner et al. |
| 2002/0154422 A1 | 10/2002 | Sniegowski et al. |
| 2002/0167072 A1 | 11/2002 | Andosca |
| 2002/0167730 A1 | 11/2002 | Needham et al. |
| 2002/0186209 A1 | 12/2002 | Cok |
| 2002/0186483 A1 | 12/2002 | Hagelin et al. |
| 2002/0197761 A1 | 12/2002 | Patel et al. |
| 2003/0011864 A1 | 1/2003 | Flanders |
| 2003/0015936 A1 | 1/2003 | Yoon et al. |
| 2003/0016428 A1 | 1/2003 | Kato et al. |
| 2003/0021004 A1 | 1/2003 | Cunningham et al. |
| 2003/0029705 A1 | 2/2003 | Qiu et al. |
| 2003/0035196 A1 | 2/2003 | Walker |
| 2003/0036215 A1 | 2/2003 | Reid |
| 2003/0043157 A1 | 3/2003 | Miles |
| 2003/0053078 A1 | 3/2003 | Missey et al. |
| 2003/0119221 A1 | 6/2003 | Cunningham et al. |
| 2003/0123125 A1 | 7/2003 | Little |
| 2003/0138669 A1 | 7/2003 | Kojima et al. |
| 2003/0156315 A1 | 8/2003 | Li et al. |
| 2003/0173504 A1 | 9/2003 | Cole et al. |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0210851 A1 | 11/2003 | Fu et al. |
| 2004/0008396 A1 | 1/2004 | Stappaerts |
| 2004/0008438 A1 | 1/2004 | Sato |

(56) References Cited

U.S. PATENT DOCUMENTS

| | | |
|---|---|---|
| 2004/0027671 A1 | 2/2004 | Wu et al. |
| 2004/0027701 A1 | 2/2004 | Ishikawa |
| 2004/0043552 A1 | 3/2004 | Strumpell et al. |
| 2004/0056742 A1 | 3/2004 | Dabbaj |
| 2004/0066477 A1 | 4/2004 | Morimoto et al. |
| 2004/0075967 A1 | 4/2004 | Lynch et al. |
| 2004/0076802 A1 | 4/2004 | Tompkin et al. |
| 2004/0080035 A1 | 4/2004 | Delapierre |
| 2004/0100594 A1 | 5/2004 | Huibers et al. |
| 2004/0100677 A1 | 5/2004 | Huibers et al. |
| 2004/0107775 A1 | 6/2004 | Kim |
| 2004/0124483 A1 | 7/2004 | Partridge et al. |
| 2004/0125281 A1 | 7/2004 | Lin et al. |
| 2004/0125347 A1 | 7/2004 | Patel et al. |
| 2004/0136045 A1 | 7/2004 | Tran |
| 2004/0140557 A1 | 7/2004 | Sun et al. |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0150939 A1 | 8/2004 | Huff |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park et al. |
| 2004/0184134 A1 | 9/2004 | Makigaki |
| 2004/0184766 A1 | 9/2004 | Kim et al. |
| 2004/0188599 A1 | 9/2004 | Viktorovitch et al. |
| 2004/0201908 A1 | 10/2004 | Kaneko |
| 2004/0207497 A1 | 10/2004 | Hsu et al. |
| 2004/0207897 A1 | 10/2004 | Lin |
| 2004/0209195 A1 | 10/2004 | Lin |
| 2004/0212026 A1 | 10/2004 | Van Brocklin et al. |
| 2004/0217264 A1 | 11/2004 | Wood et al. |
| 2004/0217378 A1 | 11/2004 | Martin et al. |
| 2004/0217919 A1 | 11/2004 | Piehl et al. |
| 2004/0218251 A1 | 11/2004 | Piehl et al. |
| 2004/0218334 A1 | 11/2004 | Martin et al. |
| 2004/0227493 A1 | 11/2004 | Van Brocklin et al. |
| 2004/0233503 A1 | 11/2004 | Kimura |
| 2004/0240138 A1 | 12/2004 | Martin et al. |
| 2004/0245588 A1 | 12/2004 | Nikkel et al. |
| 2004/0259010 A1 | 12/2004 | Kanbe |
| 2005/0001797 A1 | 1/2005 | Miller et al. |
| 2005/0001828 A1 | 1/2005 | Martin et al. |
| 2005/0002082 A1 | 1/2005 | Miles |
| 2005/0003667 A1 | 1/2005 | Lin et al. |
| 2005/0014374 A1 | 1/2005 | Partridge et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0038950 A1 | 2/2005 | Adelmann |
| 2005/0042117 A1 | 2/2005 | Lin |
| 2005/0046919 A1 | 3/2005 | Taguchi et al. |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068627 A1 | 3/2005 | Nakamura et al. |
| 2005/0069209 A1 | 3/2005 | Damera-Venkata et al. |
| 2005/0078348 A1 | 4/2005 | Lin |
| 2005/0098840 A1 | 5/2005 | Fuertsch et al. |
| 2005/0117190 A1 | 6/2005 | Iwauchi et al. |
| 2005/0117623 A1 | 6/2005 | Shchukin et al. |
| 2005/0122294 A1 | 6/2005 | Ben-David et al. |
| 2005/0122306 A1 | 6/2005 | Wilcox et al. |
| 2005/0128543 A1 | 6/2005 | Phillips et al. |
| 2005/0133761 A1 | 6/2005 | Thielemans |
| 2005/0167597 A1 | 8/2005 | Yokura et al. |
| 2005/0168849 A1 | 8/2005 | Lin |
| 2005/0179378 A1 | 8/2005 | Oooka et al. |
| 2005/0195462 A1 | 9/2005 | Lin |
| 2005/0236260 A1 | 10/2005 | Pasch et al. |
| 2005/0239275 A1 | 10/2005 | Muthukumar et al. |
| 2005/0241394 A1 | 11/2005 | Clark |
| 2005/0275930 A1 | 12/2005 | Patel et al. |
| 2006/0007517 A1 | 1/2006 | Tsai |
| 2006/0017379 A1 | 1/2006 | Su et al. |
| 2006/0017689 A1 | 1/2006 | Faase et al. |
| 2006/0022966 A1 | 2/2006 | Mar |
| 2006/0024880 A1 | 2/2006 | Chui et al. |
| 2006/0038643 A1 | 2/2006 | Xu et al. |
| 2006/0044654 A1 | 3/2006 | Vandorpe et al. |
| 2006/0065622 A1 | 3/2006 | Floyd et al. |
| 2006/0065940 A1 | 3/2006 | Kothari |
| 2006/0066641 A1 | 3/2006 | Gally et al. |
| 2006/0066938 A1 | 3/2006 | Chui |
| 2006/0067028 A1 | 3/2006 | Floyd |
| 2006/0077155 A1 | 4/2006 | Chui et al. |
| 2006/0082588 A1 | 4/2006 | Mizuno et al. |
| 2006/0082863 A1 | 4/2006 | Piehl et al. |
| 2006/0103643 A1 | 5/2006 | Mathew et al. |
| 2006/0132927 A1 | 6/2006 | Yoon |
| 2006/0144681 A1 | 7/2006 | Lee et al. |
| 2006/0171628 A1 | 8/2006 | Naniwada |
| 2006/0180886 A1 | 8/2006 | Tsang |
| 2006/0203325 A1 | 9/2006 | Faase et al. |
| 2006/0220160 A1 | 10/2006 | Miles |
| 2006/0227404 A1 | 10/2006 | Faase et al. |
| 2007/0020948 A1 | 1/2007 | Piehl et al. |
| 2007/0042521 A1 | 2/2007 | Yama |
| 2007/0077525 A1 | 4/2007 | Davis et al. |
| 2007/0086078 A1 | 4/2007 | Hagood et al. |
| 2007/0097694 A1 | 5/2007 | Faase et al. |
| 2007/0138391 A1 | 6/2007 | Garber et al. |
| 2007/0138608 A1 | 6/2007 | Ikehashi |
| 2007/0153860 A1 | 7/2007 | Chang-Hasnain et al. |
| 2007/0190886 A1 | 8/2007 | Satoh et al. |
| 2007/0205969 A1 | 9/2007 | Hagood et al. |
| 2007/0216987 A1 | 9/2007 | Hagood et al. |
| 2007/0247401 A1 | 10/2007 | Sasagawa et al. |
| 2007/0247696 A1 | 10/2007 | Sasagawa et al. |
| 2007/0249078 A1 | 10/2007 | Tung et al. |
| 2007/0249081 A1 | 10/2007 | Luo et al. |
| 2007/0253054 A1 | 11/2007 | Miles |
| 2007/0268211 A1 | 11/2007 | Whitehead et al. |
| 2007/0279730 A1 | 12/2007 | Heald |
| 2007/0285761 A1 | 12/2007 | Zhong et al. |
| 2008/0002299 A1 | 1/2008 | Thurn |
| 2008/0030657 A1 | 2/2008 | Wu et al. |
| 2008/0043315 A1 | 2/2008 | Cummings |
| 2008/0055706 A1 | 3/2008 | Chui et al. |
| 2008/0062148 A1 | 3/2008 | Hotelling et al. |
| 2008/0068697 A1 | 3/2008 | Haluzak et al. |
| 2008/0068699 A1 | 3/2008 | Miles |
| 2008/0080043 A1 | 4/2008 | Chui et al. |
| 2008/0088910 A1 | 4/2008 | Miles |
| 2008/0110855 A1 | 5/2008 | Cummings |
| 2008/0151353 A1 | 6/2008 | Haskett |
| 2008/0158645 A1 | 7/2008 | Chiang |
| 2008/0186581 A1 | 8/2008 | Bita et al. |
| 2008/0218834 A1 | 9/2008 | Wang |
| 2008/0283374 A1 | 11/2008 | Naito |
| 2008/0297880 A1 | 12/2008 | Steckl et al. |
| 2009/0009444 A1 | 1/2009 | Heald et al. |
| 2009/0021884 A1 | 1/2009 | Nakamura |
| 2009/0068838 A1 | 3/2009 | Kim et al. |
| 2009/0078316 A1 | 3/2009 | Khazeni |
| 2009/0101192 A1 | 4/2009 | Kothari et al. |
| 2009/0103166 A1 | 4/2009 | Khazeni et al. |
| 2009/0122384 A1 | 5/2009 | Felnhofer et al. |
| 2009/0126777 A1 | 5/2009 | Khazeni et al. |
| 2009/0159123 A1 | 6/2009 | Kothari |
| 2009/0174651 A1 | 7/2009 | Jacobsen et al. |
| 2009/0211885 A1 | 8/2009 | Steeneken et al. |
| 2009/0213450 A1 | 8/2009 | Sampsell |
| 2009/0213451 A1 | 8/2009 | Tung et al. |
| 2009/0231496 A1 | 9/2009 | Nishino et al. |
| 2009/0231666 A1 | 9/2009 | Gudlavalleti et al. |
| 2009/0256218 A1 | 10/2009 | Mignard et al. |
| 2009/0257105 A1 | 10/2009 | Xu et al. |
| 2009/0275163 A1 | 11/2009 | Lacey et al. |
| 2009/0279162 A1 | 11/2009 | Chui |

(56) References Cited

U.S. PATENT DOCUMENTS

| | | |
|---|---|---|
| 2009/0293955 A1 | 12/2009 | Kothari et al. |
| 2009/0323153 A1 | 12/2009 | Sampsell |
| 2010/0014148 A1 | 1/2010 | Djordjev |
| 2010/0051089 A1 | 3/2010 | Khazeni et al. |
| 2010/0053148 A1 | 3/2010 | Khazeni et al. |
| 2010/0079847 A1 | 4/2010 | Patel et al. |
| 2010/0096006 A1 | 4/2010 | Griffiths |
| 2010/0096011 A1 | 4/2010 | Griffiths |
| 2010/0118382 A1 | 5/2010 | Kothari et al. |
| 2010/0182675 A1 | 7/2010 | Sampsell et al. |
| 2010/0236624 A1 | 9/2010 | Khazeni et al. |
| 2010/0238572 A1 | 9/2010 | Tao et al. |
| 2010/0309572 A1 | 12/2010 | Mignard |
| 2011/0019380 A1 | 1/2011 | Miles |
| 2011/0026095 A1 | 2/2011 | Kothari et al. |
| 2011/0026096 A1 | 2/2011 | Miles |
| 2011/0038027 A1 | 2/2011 | Miles |
| 2011/0044496 A1 | 2/2011 | Chui et al. |
| 2011/0063712 A1 | 3/2011 | Kothari et al. |
| 2011/0069371 A1 | 3/2011 | Kothari et al. |
| 2011/0075241 A1 | 3/2011 | Mienko et al. |
| 2011/0075245 A1 | 3/2011 | Hashimura et al. |
| 2011/0080632 A1 | 4/2011 | Miles |
| 2011/0090554 A1 | 4/2011 | Tung |
| 2011/0115762 A1 | 5/2011 | Sasagawa et al. |
| 2011/0116156 A1 | 5/2011 | Kothari |
| 2011/0134505 A1 | 6/2011 | Sasagawa |
| 2011/0169724 A1 | 7/2011 | Tao et al. |
| 2011/0170166 A1 | 7/2011 | Miles |
| 2011/0170167 A1 | 7/2011 | Miles |
| 2011/0170168 A1 | 7/2011 | Endisch et al. |
| 2011/0177745 A1 | 7/2011 | Lasiter |
| 2011/0188109 A1 | 8/2011 | Chui et al. |
| 2011/0188110 A1 | 8/2011 | Miles |
| 2011/0194169 A1 | 8/2011 | Ganti et al. |
| 2011/0249315 A1 | 10/2011 | Tao et al. |
| 2012/0122259 A1 | 5/2012 | Tung et al. |
| 2012/0242638 A1* | 9/2012 | Zhong et al. .......... 345/211 |
| 2012/0248478 A1 | 10/2012 | Lee et al. |

FOREIGN PATENT DOCUMENTS

| | | |
|---|---|---|
| DE | 4108966 A1 | 9/1992 |
| DE | 10228946 A1 | 1/2004 |
| DE | 10 2006 039 071 | 2/2008 |
| EP | 0071287 A1 | 2/1983 |
| EP | 0 035 299 | 9/1983 |
| EP | 0310176 A2 | 4/1989 |
| EP | 0332953 A2 | 9/1989 |
| EP | 0361981 A2 | 4/1990 |
| EP | 0 668 490 | 8/1995 |
| EP | 0667548 A1 | 8/1995 |
| EP | 0 695 959 | 2/1996 |
| EP | 0788005 A2 | 8/1997 |
| EP | 0 879 991 | 11/1998 |
| EP | 0 969 306 | 1/2000 |
| EP | 0 986 077 | 3/2000 |
| EP | 1 122 577 | 8/2001 |
| EP | 1146533 A1 | 10/2001 |
| EP | 1172681 A2 | 1/2002 |
| EP | 1 205 782 | 5/2002 |
| EP | 1 227 346 | 7/2002 |
| EP | 1 275 997 | 1/2003 |
| EP | 1 403 212 | 3/2004 |
| EP | 1435336 A2 | 7/2004 |
| EP | 1439515 A2 | 7/2004 |
| EP | 1 473 581 | 11/2004 |
| EP | 1473691 A2 | 11/2004 |
| EP | 1486999 A2 | 12/2004 |
| EP | 1802114 A2 | 6/2007 |
| EP | 1 928 028 | 6/2008 |
| FR | 2824643 A1 | 11/2002 |
| FR | 2843230 A1 | 2/2004 |
| JP | 56-088111 | 7/1981 |
| JP | 62082454 | 4/1987 |
| JP | 03-180890 | 8/1991 |
| JP | 4009625 A2 | 1/1992 |
| JP | 04-276721 | 10/1992 |
| JP | 5-49238 | 2/1993 |
| JP | 5-281479 | 10/1993 |
| JP | 5275401 A | 10/1993 |
| JP | 08-051230 | 2/1996 |
| JP | 8292382 | 11/1996 |
| JP | 9127439 | 5/1997 |
| JP | 11-211999 | 8/1999 |
| JP | 2000 147262 | 5/2000 |
| JP | 2000306515 A | 11/2000 |
| JP | 2001-221913 | 8/2001 |
| JP | 2001 249283 | 9/2001 |
| JP | 2002-062490 | 2/2002 |
| JP | 2002052500 A | 2/2002 |
| JP | 2002174721 A | 6/2002 |
| JP | 2002-221678 | 8/2002 |
| JP | 2002243937 | 8/2002 |
| JP | 2002277771 A | 9/2002 |
| JP | 2002287047 A | 10/2002 |
| JP | 2003-340795 | 2/2003 |
| JP | 2003 177336 | 6/2003 |
| JP | 2003195201 A | 7/2003 |
| JP | 2003315732 A | 11/2003 |
| JP | 2004-012642 | 1/2004 |
| JP | 2004141995 A | 5/2004 |
| JP | 2004157527 A | 6/2004 |
| JP | 2004-212638 | 7/2004 |
| JP | 2004-212680 | 7/2004 |
| JP | 2004235465 | 8/2004 |
| JP | 2004261884 A | 9/2004 |
| JP | 2004286825 A | 10/2004 |
| JP | 2005118944 A | 5/2005 |
| JP | 2005157133 A | 6/2005 |
| JP | 2005215323 A | 8/2005 |
| JP | 2005 279831 | 10/2005 |
| JP | 2005-308871 | 11/2005 |
| JP | 2006099018 A | 4/2006 |
| JP | 2006269127 A | 10/2006 |
| JP | 2007 027150 | 2/2007 |
| KR | 20020010322 | 2/2002 |
| TW | 157313 | 5/1991 |
| WO | WO-9105284 | 4/1991 |
| WO | WO-9503562 A1 | 2/1995 |
| WO | WO 98/14804 | 4/1998 |
| WO | WO 98/43129 | 10/1998 |
| WO | WO-9852224 A1 | 11/1998 |
| WO | WO 98/59382 | 12/1998 |
| WO | WO 01/53113 | 7/2001 |
| WO | WO 02/024570 | 3/2002 |
| WO | WO-02063602 A1 | 8/2002 |
| WO | WO-02063682 A2 | 8/2002 |
| WO | WO-02071132 A2 | 9/2002 |
| WO | WO 02/086582 | 10/2002 |
| WO | WO-02079853 A1 | 10/2002 |
| WO | WO-02096796 A2 | 12/2002 |
| WO | WO-03014789 A2 | 2/2003 |
| WO | WO-03041133 A2 | 5/2003 |
| WO | WO-03046508 A2 | 6/2003 |
| WO | WO-03054925 A2 | 7/2003 |
| WO | WO-03079384 A2 | 9/2003 |
| WO | WO-03085728 A2 | 10/2003 |
| WO | WO 03/105198 | 12/2003 |
| WO | WO-2004000717 | 12/2003 |
| WO | WO-2004042687 A2 | 5/2004 |
| WO | WO-2005006364 A1 | 1/2005 |
| WO | WO-2005010566 A2 | 2/2005 |
| WO | WO 2006/035698 | 4/2006 |
| WO | WO-2006091738 A1 | 8/2006 |
| WO | WO-2007022476 A1 | 2/2007 |
| WO | WO 2007/036422 | 4/2007 |
| WO | WO 2007/045875 | 4/2007 |
| WO | WO 2007/053438 | 5/2007 |
| WO | WO 2007/072998 | 6/2007 |
| WO | WO 2008/062363 | 5/2008 |
| WO | WO-2010006213 A1 | 1/2010 |
| WO | WO-2010111153 A2 | 9/2010 |

(56) References Cited

FOREIGN PATENT DOCUMENTS

OTHER PUBLICATIONS

Conner, Hybrid Color Display Using Optical Interference Filter Array, SID Digest, pp. 577-580 (1993).
Feenstra et al., Electrowetting displays, Liquavista BV, 16 pp., Jan. 2006.
Fork, et al., Chip on Glass Bonding Using StressedMetal™ Technology, SID 05 Digest, pp. 534-537, 2005.
Hohlfeld et al., Jun. 2003, Micro-machined tunable optical filters with optimized band-pass spectrum, 12th International Conference on Transducers, Solid-State Sensors, Actuators and Microsystems, 2:1494-1497.
Jerman et al., A Miniature Fabry-Perot Interferometer with a Corrugated Silicon Diaphragm Support, (1988).
Jerman et al., Miniature Fabry-Perot Interferometers Micromachined in Silicon for Use in Optical Fiber WDM Systems, Transducers, San Francisco, Jun. 24-27, 1991, Proceedings on the Int'l. Conf. on Solid State Sensors and Actuators, Jun. 24, 1991, pp. 372-375.
Kowarz et al., Conformal grating electromechanical system (GEMS) for high-speed digital light modulation, Proceedings of the IEEEE 15th. Annual International Conference on Micro Electro Mechanical Systems, MEMS 2002, pp. 568-573.
Lezec, Submicrometer dimple array based interference color field displays and sensors, Nano Lett. 7(2):329-333, Dec. 23, 2006.
Londergan et al., Advanced processes for MEMS-based displays, Proceedings of the Asia Display 2007, SID, 1:107-112.
Longhurst, 1963, Chapter IX: Multiple Beam Interferometry, in Geometrical and Physical Optics, pp. 153-157.
Mehregany et al., 1996, MEMS applications in optical systems, IEEE/LEOS 1996 Summer Topical Meetings, pp. 75-76.
Miles et al, Oct. 21, 1997, A MEMS based interferometric modulator (IMOD) for display applications, Proceedings of Sensors Expo, pp. 281-284.
Brosnihan et al., Jun. 2003, Optical IMEMS—a fabrication process for MEMS optical switches with integrated on-chip electronic, Transducers, Solid-State Sensors, Actuators and Microsystems, 12th International Conference 2003, 2(8-12):1638-1642.
Cacharelis et al., 1997, A Reflective-mode PDLC Light Valve Display Technology, Proceedings of European Solid State Device Research Conference (ESSDERC), pp. 596-599.
Dokmeci et al., Dec. 2004, Two-axis single-crystal silicon micromirror arrays, Journal of Microelectromechanical Systems, 13(6):1006-1017.
Maier et al., 1996, 1.3" active matrix liquid crystal spatial light modulator with 508 dpi resolution, SPIE vol. 2754, pp. 171-179.
Miles, A New Reflective FPD Technology Using Interferometric Modulation, Journal of the SID, 5/4, 1997.
Miles, Interferometric modulation: MOEMS as an enabling technology for high performance reflective displays, Proceedings of SPIE, 4985:131-139, 2003.
Nakagawa et al., Feb. 1, 2002, Wide-field-of-view narrow-band spectral filters based on photonic crystal nanocavities, Optics Letters, 27(3):191-193.
Nieminen et al., 2004, Design of a temperature-stable RF MEM capacitor, IEEE Journal of Microelectromechanical Systems, 13(5):705-714.
Pape et al., Characteristics of the deformable mirror device for optical information processing, Optical Engineering, 22(6):676-681, Nov.-Dec. 1983.
Qualcomm MEMS Technologies, Inc., May 2008, Interferometric Modulator (IMOD) Technology Overview, White Paper, 14 pp.
Taii et al., A transparent sheet display by plastic MEMS, Journal of the SID 14(8):735-741, 2006.
Tolansky, 1948, Chapter II: Multiple-Beam Interference, in Multiple-bean Interferometry of Surfaces and Films, Oxford at the Clarendon Press, pp. 8-11.

Wang, Jun. 29-Jul. 1, 2002, Design and fabrication of a novel two-dimension MEMS-based tunable capacitor, IEEE 2002 International Conference on Communications, Circuits and Systems and West Sino Expositions, 2:1766-1769.
Akasaka Y., "Three-Dimensional IC Trends," Proceedings of IEEE, 1986, vol. 74 (12), pp. 1703-1714.
Aratani K, et al., "Process and Design Considerations for Surface Micromachined Beams for a Tuneable Interferometer Array in Silicon," Proc. IEEE Microelectromechanical workshop fort Lauderdale FL, 1993, 230-235.
Aratani K. et al., "Surface Micromachined Tuneable Interferometer Array," Sensors and Actuators A, Elsevier Sequoia S.A., Lausanne, CH, A, 1993, 43(1/3), 17-23.
Bass, "Fundamentals Techniques and Design Second Edition," Handbook of Optics, 1995, vol. 1, 2.29-2.36.
Bouchaud J, et al., " Rf MEMS Analysis forecasts and Technology Review Chip Unaxis," Sep. 2003, P. 26-29 [online] Retrieved From the Internet: &LtUrl:Http://Semiconductors.Unaxis.Com/En/Download/Rf%20Mems.Pdf&Gt. Cited by Other.
Butler, et al., "An Embedded Overlay Concept for Microsystems Packaging," IEEE Transactions on Advanced Packaging IEEE, 2000, vol. 23(4), 617-622.
Chan, et al., "Low-Actuation Voltage RF Mems Shunt Switch With Cold Switching Lifetime of Seven Billion Cycles," Journal of Microelectromechanical Systems, vol. 12(5), 713-719.
Chiou, et al., "A Novel Capacitance Control Design of Tunable Capacitor using Multiple Electrostatic Driving Electrodes," IEEE Nanoelectronics and Giga-Scale Systems, 2001, 319-324.
Fan, et al., "Channel Drop Filters in Photonic Crystals," Optics Express, 1998, vol. 3(1), pp. 4-11.
Farooqui, et al., "A Polysilicon-Diaphragm-Based Pressure Sensor Technology," Journal of Physics E. Scientific Instruments, Dec. 1, 1987, 20(12), 1469-1471.
Farooqui, et al., "Polysilicon Microstructures Proceedings of the workshop on Micro Electro Mechanical Systems. lnvestigation of Micro Structures," Sensors, Actuators, Machines and Robots, Jan. 30,1991, pp. 187-191.
Giles, et al., "A Silicon Mems Optical Switch Attenuator and its Use in Lightwave Subsystems," IEEE Journal of Selected Topics in Quantum Electronics, 1999, 5 (1), 18-25.
Goldsmith, et al., "Performance of Low-Loss RF Mems Capacitive Switches," IEEE Microwave and Guided Wave Letters, Aug. 1998, 8(8), 269-271.
Goossen K.W. et al., "Possible Display Applications of the Silicon Mechanical Antireflection Switch," Society for Information Display, 1994.
Goossen K.W., "MEMS-Based Variable Optical Interference Devices," IEEE/Lens International Conference on Optical Mems, Conference Digest, Piscataway, NJ, USA, IEEE Aug. 21, 2000, pp. 17-18.
Gosch, "West Germany Grabs the Lead in X-Ray Lithography," Electronics, 1987, 78-80.
Han, et al., "Color Display using Micromechanically Coupled Mirrors," Applied Physics Letters 97, 251105 (2010), 3 pages.
Heuer a.H., "LPCVD Polysilicon Films with Controlled Curvature for Optical MEMS: the MultiPoly Process", 2000 IEEE/LEOS International Conference on Optical MEMS (Cat. No. 00EX399), Jan. 1, 2000, pp. 117-118.
Howard, et al., "Nanometer-Scale Fabrication Techniques," VLSI Electronics: Microstructure Science, 1982, vol. 5, 145-153, 166-173.
Ibbotson, et al., "Comparison of XeF.sub.2 and F-atom Reactions with Si and SiO.sub.2," Applied Physics Letters, 1984, 44(12), 1129-1131.
International Search Report and Written Opinion dated Jul. 11, 2012 in PCT/US12/031643.
Jackson, "Classical Electrodynamics," John Wiley & Sons Inc, 1962, pp. 568-573.
Joannopoulos, et al., "Photonic Crystals Molding the Flow of Light," Princeton University Press, 1995.
Johnson, "Optical Scanners," Microwave Scanning Antennas, 1964, vol. 1(2), 251-261.

(56) References Cited

OTHER PUBLICATIONS

Kim, et al., "Control of Optical Transmission Through Metals Perforated With Subwave-Length Hole Arrays," Optic Letters, 1999, vol. 24(4), 256-258.
Li, et al., "CMOS Micromachine Capacitive Cantilevers for Mass Sensing," Journal of Micromechanics and Microengineering, Dec. 2006, 16(12).
Li G.P., "The Design and Fabrication of Electrostatic RF MEMS Switches," Final Report 1999-00 for Micro Project 99-071.
Light Over Matter Circle No. 36, Jun. 1993.
Lin, et al., "Free-Space Micromachined Optical Switches for Optical NetWorking," IEEE Journal of Selected Topics in Quantum Electronics, 1999, vol. 5(1), 4-9.
Little, et al., "Vertically Coupled Microring Resonator Channel Dropping Filter," IEEE Photonics Technology Letters, 1999, 11(2), 215-217.
Magel G.A., "Integrated Optic Devices using Micromachined Metal Membranes," SPIE, 1996, vol. 2686, 54-63.
Matt, "Design of Diffractive Optical Elements for Optical Signal Processing," IEEE Lasers and Electro-Optics Society Annual Meeting, 1993, 59-60.
Nagami, et al., "Plastic Cell Architecture: Towards Reconfigurable Computing for General-Purpose, 0-8186-8900," IEEE, 1998, 68-77.
Newsbreaks, "Quantum-trench devices might operated at terahertz frequencies", Laser Focus World, May 1993.
Oliner, "Radiating Elements and Mutual Coupling," Microwave Scanning Antennas, 1966, vol. 2, 131-157 and pp. 190-194.
Pacheco, et al., "Design of Low Actuation Voltage RF MEMS Switch," IEEE (2000), 0-7803-5687-X/00/ Radiation Laboratory and Center in Microsystems Department of Electrical Engineering and Computer Science University of Michigan.
Panitz et al., "Electrostatic actuated interference filters as optical switches for projection display applications," the 12th International Conference on Solid state Sensors, Actuators and Microsystems, Jun. 8-12, 2003, pp. 580-582.
Peerlings et al., "Long Resonator Micromachined Tunable GaAs-AlAs Fabry-Perot Filter," IEEE Photonics Technology Letters, IEEE Service Center, 1997, vol. 9(9), 1235-1237.
Raley, et al., "A Fabry-Perot Microinterferometer for Visible Wavelengths," IEEE Solid-State Sensor and Actuator Workshop, 1992, 170-173.
Schnakenberg, et al., "TMAHW Etchants for Silicon Micromachining," International Conference on Solid State Sensors and Actuators-Digest of Technical Papers, 1991, 815-818.
Science and Technology, The Economist, pp. 89-90, (May 1999).
Solgaard, et al., "Interference-Based Optical MEMS Filters," Optical 2004 Fiber Communication Conference, 2004, vol. 1.
Sperger, et al., "High Performance Patterned All-Dielectric Interference Colour Filter for Display Applications," SID Digest, 1994, 81-83.
Stone J.M., "Radiation and Optics, An Introduction to the Classic Theory," 1963, McGraw-Hill, pp. 340-343.
Tan, et al., "RF MEMS Simulation-High Isolation CPW Shunt Switches," Ansoft Global Seminars Delivering Performance, 2003.
Temple-Boyer P., et al., "Properties of SiOxNy films deposited by LPCVD from SiH4/N2O/NH3 gaseous mixture", Sensors and Actuators a, Elsevier Sequoia S.A., Lausanne, CH, vol. 74, No. 1-3, Apr. 20, 1999, pp. 52-55.
Walker, et al., "Electron-Beam-Tunable Interference Filter Spatial Light Modulator," Optics Letters, 1988, vol. 13(5), 345-347.
Wang, et al., "Flexible Circuit-Based RF MEMS Switches," Proceedings of 2001 ASME International Mechanical Engineering Congress and Exposition, Nov. 11-16 2001 pp. 757-762.
Williams, et al., "Etch Rates for Micromachining Processing," Journal of Microelectromechanical Systems, 1996, vol. 5(4), 256-269.
Winters, et al., "The Etching of Silicon with XeF2 Vapor," Applied Physics Letters, 1979, vol. 34(1), 70-73.
Winton et al., "A novel way to capture solar energy," Chemical Week, pp. 17-18 (May 15, 1985).
Wu, et al., "Design of a Reflective Color LCD using Optical Interference Reflectors," Asia Display, Changchun Institute of Physics, 1995, 929-931.
Wu, et al., "MEMS Designed for Tunable Capacitors," Microwave Symposium Digest, IEEE MTT-S Int'l., 1998, vol. 1, 127-129.
Zhou et al., "Waveguide Panel Display Using Electromechanism Spatial Modulators," SID Digest, 1998, vol. XXIX.

\* cited by examiner

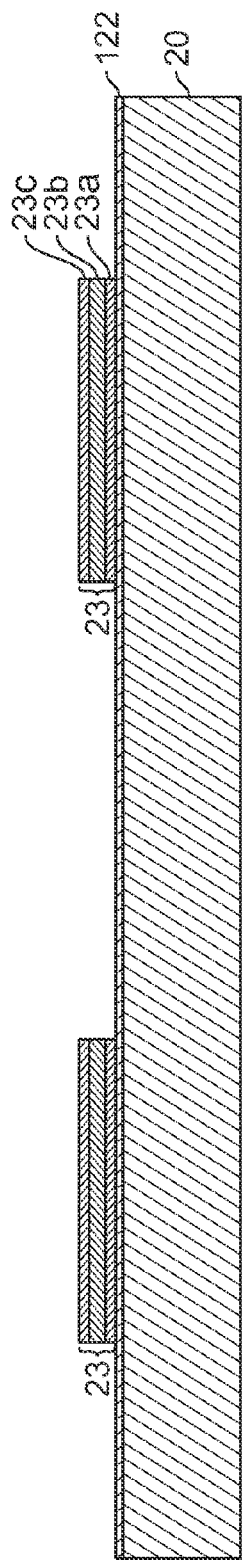
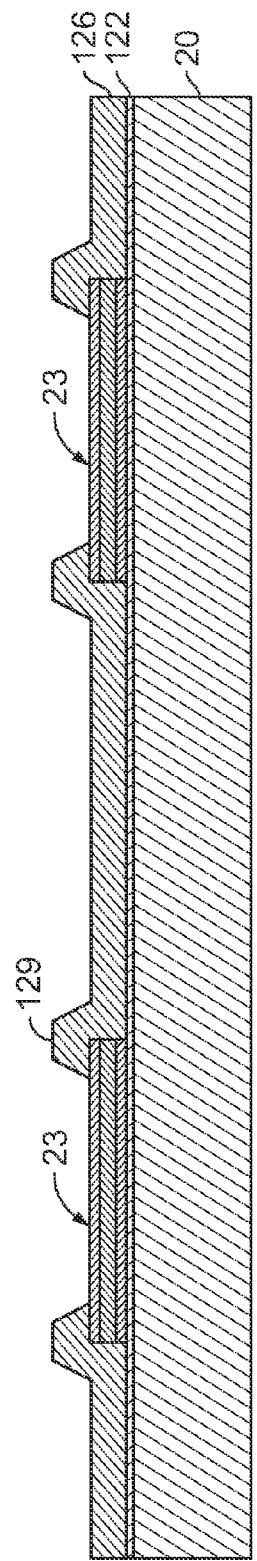

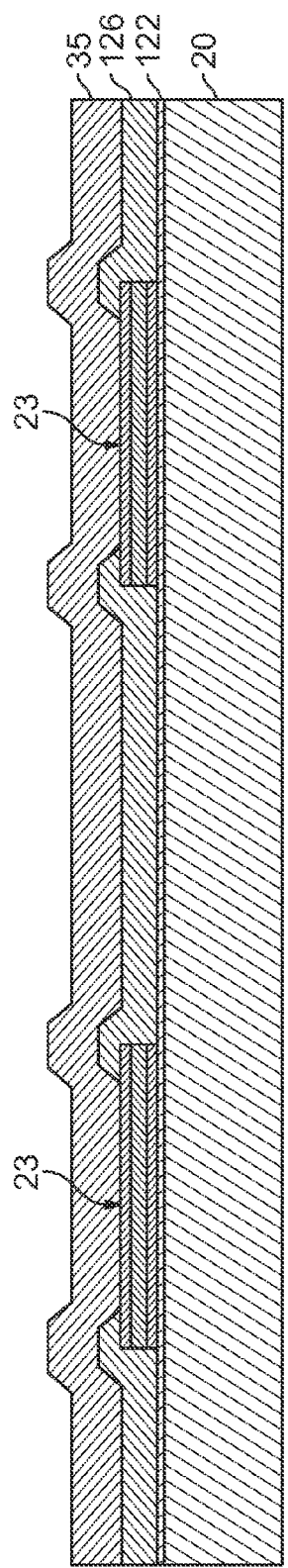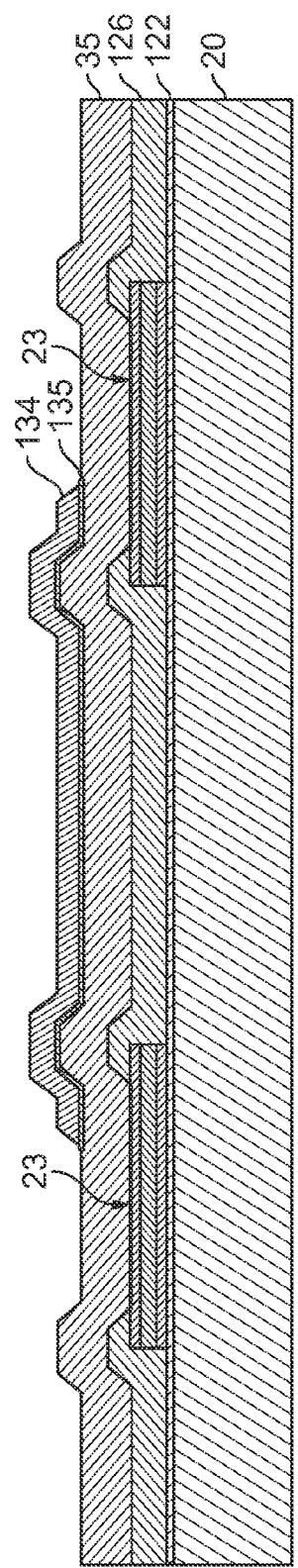

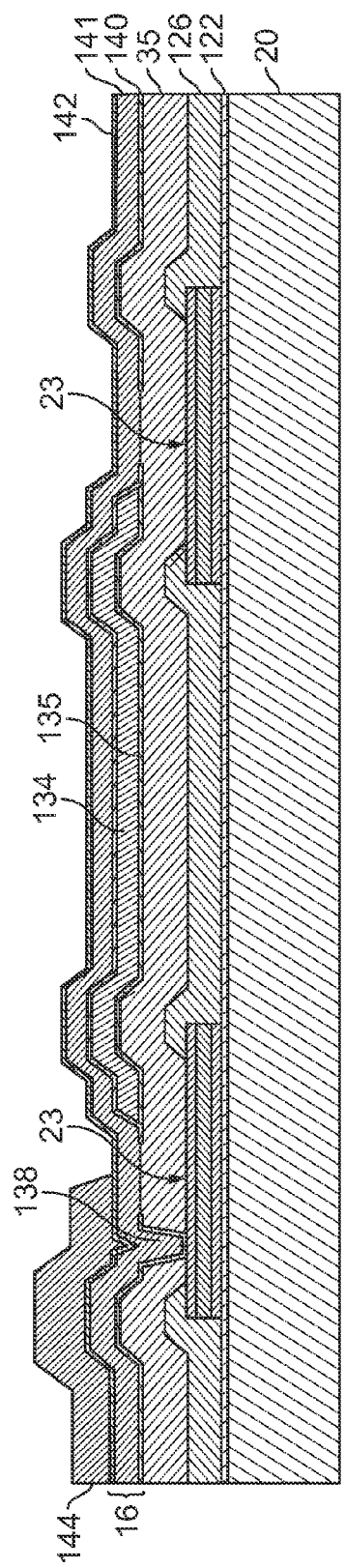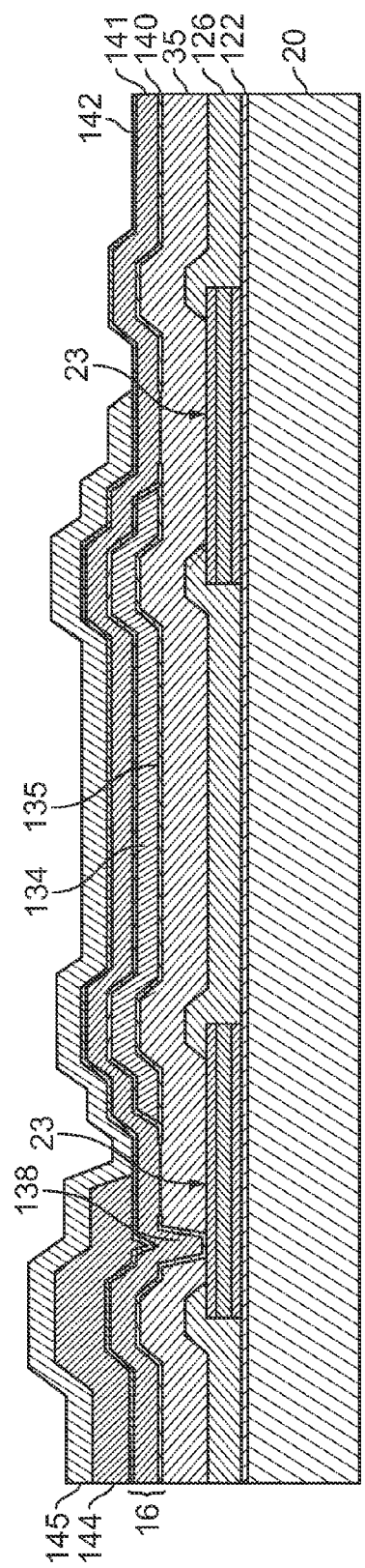

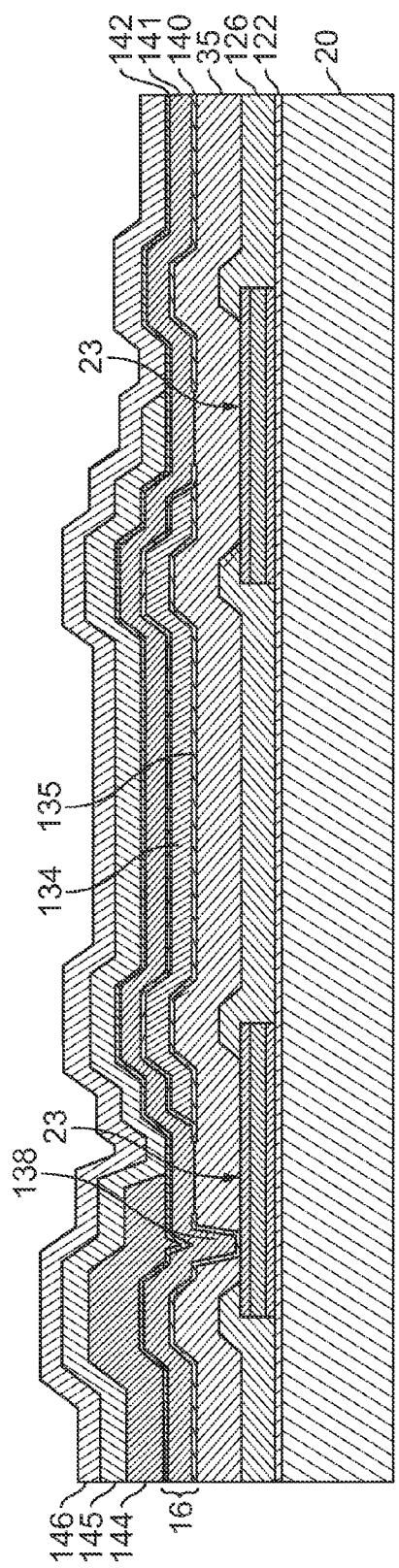
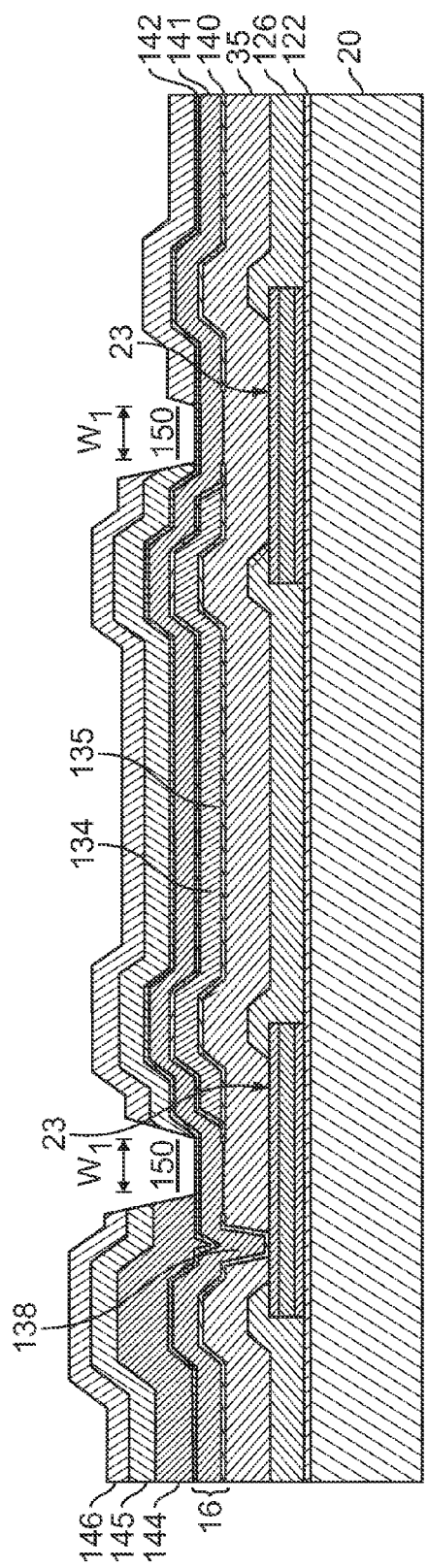
Figure 10J
Figure 10K

PIXEL VIA AND METHODS OF FORMING THE SAME

CROSS-REFERENCE TO RELATED APPLICATIONS

This disclosure is related to U.S. application Ser. No. 13/079,487, entitled "PIXEL VIA AND METHODS OF FORMING THE SAME", and filed on the same date herewith, the disclosure of which is incorporated herein by reference in its entirety.

TECHNICAL FIELD

This disclosure relates to electromechanical systems.

DESCRIPTION OF THE RELATED TECHNOLOGY

Electromechanical systems include devices having electrical and mechanical elements, actuators, transducers, sensors, optical components (e.g., mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

An interferometric device array can include a mechanical layer that is anchored at corners of each pixel. A black mask can be included at corners and between pixels to absorb light in optically inactive regions of each pixel. The black mask region can improve a contrast ratio of the display, while also reducing fill factor. There is a need for interferometric devices having smaller anchoring areas for the mechanical layer and improved fill factor.

SUMMARY

The systems, methods and devices of the disclosure each have several innovative aspects, no single one of which is solely responsible for the desirable attributes disclosed herein.

One innovative aspect of the subject matter described in this disclosure can be implemented in a device including an array of pixels, each pixel having a substrate, an electrically conductive black mask disposed on the substrate and masking an optically non-active portion of the pixel at each of four corners of the pixel and along at least one edge region of the pixel, a dielectric layer disposed over the black mask, an optical stack including a stationary electrode disposed over the dielectric layer, and a mechanical layer positioned over the optical stack and defining a cavity between the mechanical layer and the optical stack. The mechanical layer is movable through the cavity between an actuated position and a relaxed position, and the mechanical layer is anchored over the optical stack at each corner of the pixel. The array of pixels includes a first pixel having a conductive via in the dielectric layer electrically connecting the stationary electrode to the black mask, the conductive via disposed in a position along an edge of the first pixel in an optically non-active area of the first pixel. The position of the conductive via is spaced offset from the edge of the first pixel in a direction towards the center of the first pixel.

In some implementations, the array of pixels further includes a second pixel adjacent the first pixel along the edge of the first pixel, and the second pixel does not include a via in the dielectric layer for electrically connecting the stationary electrode to the black mask. According to some implementations, the first pixel is a high gap pixel and the second pixel is a mid gap pixel, and the array of pixels further includes a low gap pixel adjacent the high gap pixel on a side of the high gap pixel opposite the mid gap pixel, and the low gap pixel does not include a via in the dielectric layer for electrically connecting the stationary electrode to the black mask.

Another innovative aspect of the subject matter described in this disclosure can be implemented in a method of forming a display device having a plurality of pixels. The method includes depositing an electrically conductive black mask on a substrate, the black mask masking an optically non-active portion of the pixel at each of four corners of each pixel and along at least one edge region of each pixel. The method further includes depositing a dielectric layer over the black mask, depositing an optical stack including a stationary electrode over the dielectric layer, and depositing the mechanical layer over the optical stack. The mechanical layer defines a cavity between the mechanical layer and the optical stack. The method further includes anchoring the mechanical layer over the optical stack at each corner of each pixel and providing a conductive via in a first pixel of the device, the via disposed in the dielectric layer and electrically connecting the stationary electrode to the black mask. The via is disposed in a position along an edge of the first pixel in an optically non-active area of the first pixel, and the position of the conductive via is spaced offset from the edge of the first pixel in a direction towards the center of the first pixel.

Another innovative aspect of the subject matter described in this disclosure can be implemented in an electromechanical device that includes a plurality of pixels, each pixel including a substrate, a light absorbing means disposed on the substrate and masking an optically non-active portion of the pixel at each of four corners of the pixel and along at least one edge region of the pixel, a dielectric layer disposed over the light absorbing means, and an optical stack including a stationary electrode disposed over the dielectric layer, and a mechanical layer positioned over the optical stack to define a cavity between the mechanical layer and the optical stack. The mechanical layer is movable through the cavity between an actuated position and a relaxed position, and the mechanical layer is anchored over the optical stack at each corner of the pixel. The array of pixels includes a first pixel having a means in the dielectric layer for electrically connecting the stationary electrode to the light absorbing means, the connecting means disposed in a position along an edge of the first pixel in an optically non-active area of the first pixel. The position of the connecting means is spaced offset from the edge of the first pixel in a direction towards the center of the first pixel. In some implementations, a distance from a center of the via to the edge of the first pixel ranges between about 1 µm to about 3 µm. In some implementations, the first pixel is a high gap pixel, and wherein the plurality of pixels further includes a mid gap pixel adjacent the first pixel along the edge of the first pixel, and wherein the plurality of pixels further includes a low gap pixel adjacent the first pixel opposite the mid gap pixel, wherein the mid gap and low gap pixels do not include a means in the dielectric layer for electrically connecting the stationary electrode to the black mask.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
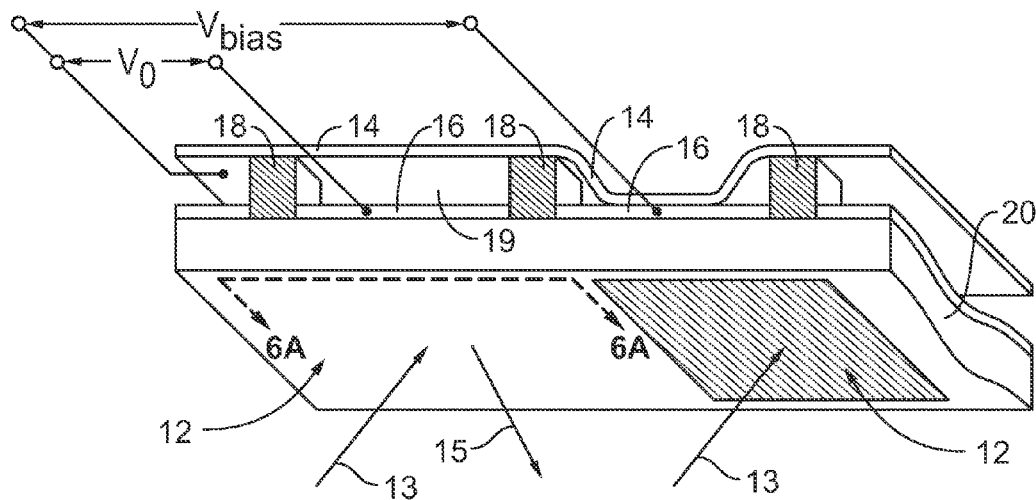
FIG. 1 shows an example of an isometric view depicting two adjacent pixels in a series of pixels of an interferometric modulator (IMOD) display device.

The following detailed description is directed to certain implementations for the purposes of describing the innovative aspects. However, the teachings herein can be applied in a multitude of different ways. The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, Bluetooth devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (e.g., electromechanical systems (EMS), MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes, electronic test equipment. Thus, the teachings are not intended to be limited to the implementations depicted solely in the Figures, but instead have wide applicability as will be readily apparent to one having ordinary skill in the art.

Electromechanical devices having improved fill factor are disclosed. The fill factor of an electromechanical device, or ratio of optically active area of the device relative to the total area of the electromechanical device, can be limited by the area of a light absorbing black mask. The electromechanical device can be an interferometric modulator device including a plurality of pixels and a mechanical layer anchored to an optical stack over the black mask at corners of each pixel. In some implementations, a conductive via is used for electrically connecting a stationary electrode of the device to the black mask. The via is offset from where the mechanical layer is anchored over the optical stack to aid in reducing the area of the black mask. For example, offsetting the via from an anchoring region used to anchor the mechanical layer over the optical stack at a pixel corner can reduce the size of the black mask at the pixel corner, since the anchoring region need not be sized to account for misalignment between the pixel via and the anchoring region. By reducing the area of the black mask at pixel corners, the optically non-active area of the array can be reduced, thereby improving fill factor. In some implementations, a via is not included in the dielectric layer of every pixel. Rather, the via can be located periodically throughout an interferometric modulator device, for example, near a corner of a pixel configured with a high gap (or cavity) height to reduce the total area of the black mask and to improve fill factor. For example, a via can be located only near a corner of a pixel (or sub-pixel) having the highest gap in a configuration that includes pixels (or sub-pixels) having various gap heights.

In some other implementations, a conductive via is disposed in a position along an edge of a pixel in an optically non-active area of the pixel, and the via is spaced offset from the edge of the pixel in a direction towards the center of the pixel. The black mask can include a channel extending from a corner of the pixel to the via along the edge of the pixel. A side of the channel can include a widened portion (or a bulge) that is generally wider than the rest of the channel width. The bulge surrounds the footprint of the via which aids in increasing robustness of the via to process variations. In some implementations, the via need not be included along each edge of each pixel. Rather, the via can be provided for only certain edges of certain pixels, for example, in a high gap pixel along an edge shared by the high gap and a mid gap pixel, to reduce the total area of the black mask.

Particular implementations of the subject matter described in this disclosure can be implemented to realize one or more of the following potential advantages. In some implementations, a pixel array can include improved fill factor and/or a black mask having reduced area. Additionally, some implementations can increase process robustness of a via used for electrically connecting a black mask to a stationary electrode in an interferometric device. Furthermore, some implementations can improve yield of an interferometric device by improving tolerance of the device to manufacturing variation. Moreover, some implementations can be used to reduce the number of vias in a pixel array and/or provide a pixel array having vias over only a fraction of the array.

An example of a suitable electromechanical systems (EMS) or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12. In the IMOD 12 on the left (as illustrated), a mechanical layer or movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the pixel 12 on the left. Although not illustrated in detail, most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the pixel 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be on the order of less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the pixel 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated pixel 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
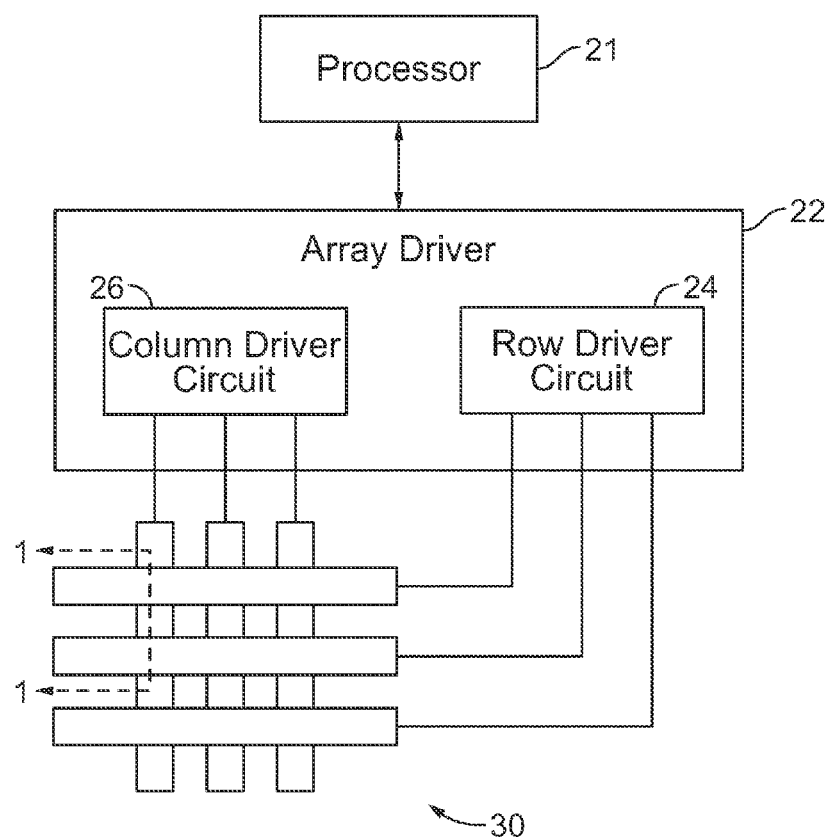
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
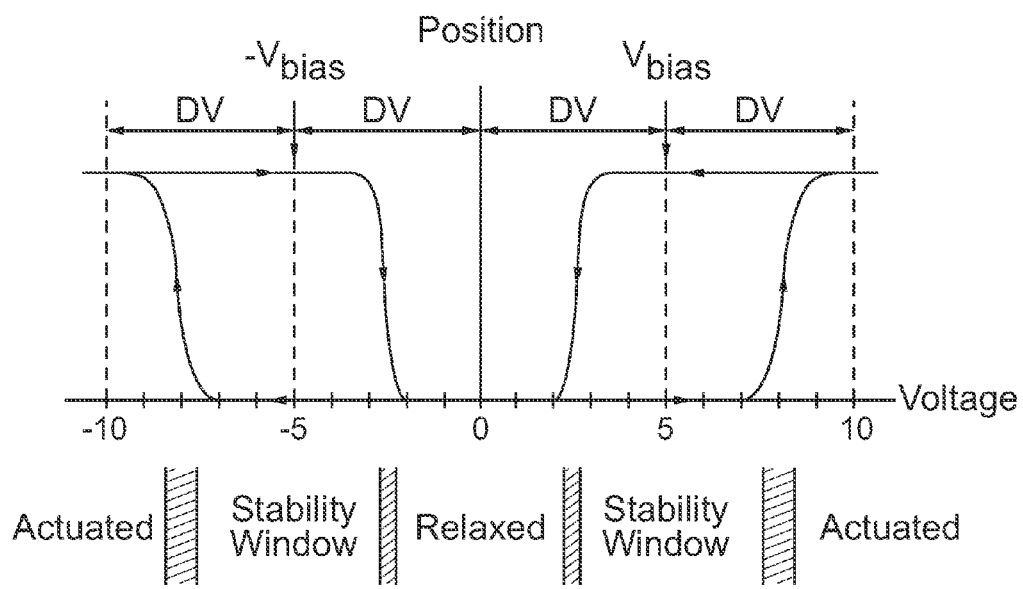
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of these devices as illustrated in FIG. 3. An interferometric modulator may use, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10-volts, however, the movable reflective layer does not relax completely until the voltage drops below 2-volts. Thus, a range of voltage, approximately 3 to 7-volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10-volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7-volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment"

voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
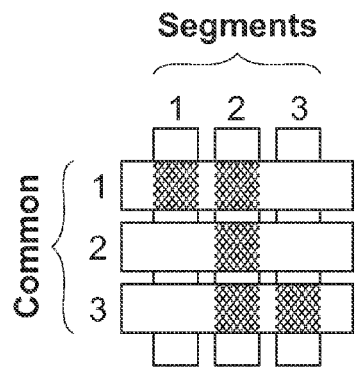
FIG. 5A shows an example of a diagram illustrating a frame of display data in the 3×3 interferometric modulator display of FIG. 2.
Figure 5B:
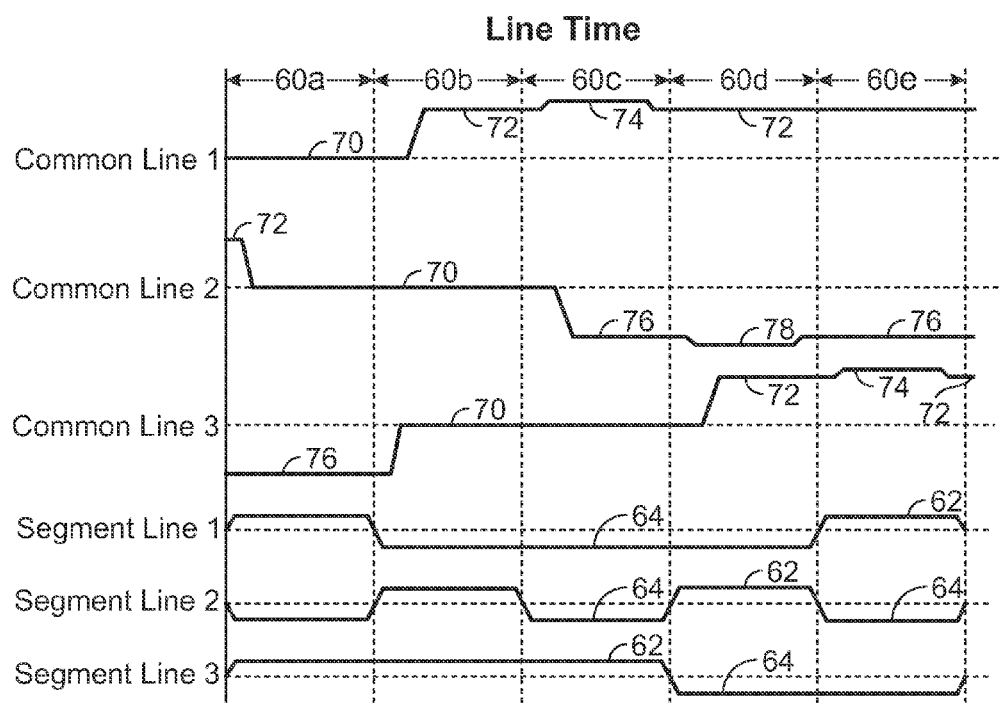
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a: a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$—relax and $VC_{HOLD\_L}$—stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
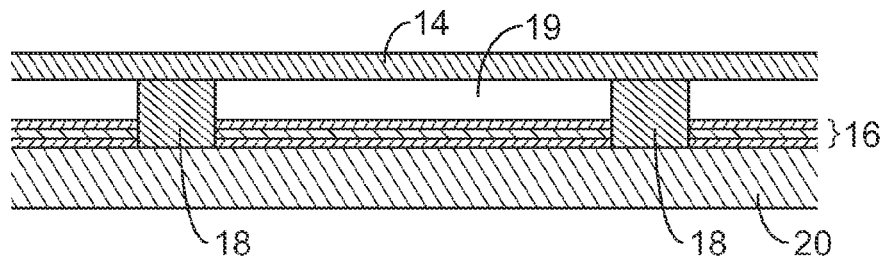
FIG. 6A shows an example of a partial cross-section of the interferometric modulator display of FIG. 1.
Figure 6B:
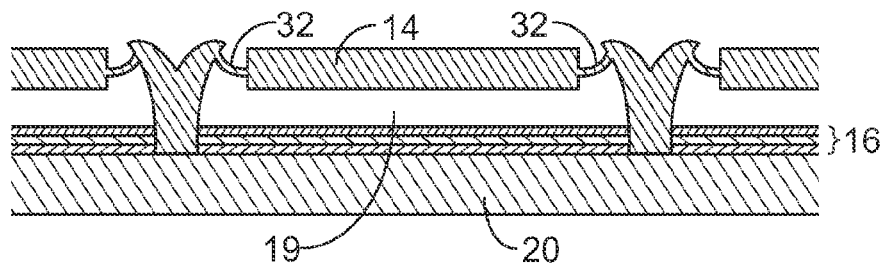
FIGS. 6B-6E show examples of cross-sections of varying implementations of interferometric modulators.
Figure 6C:
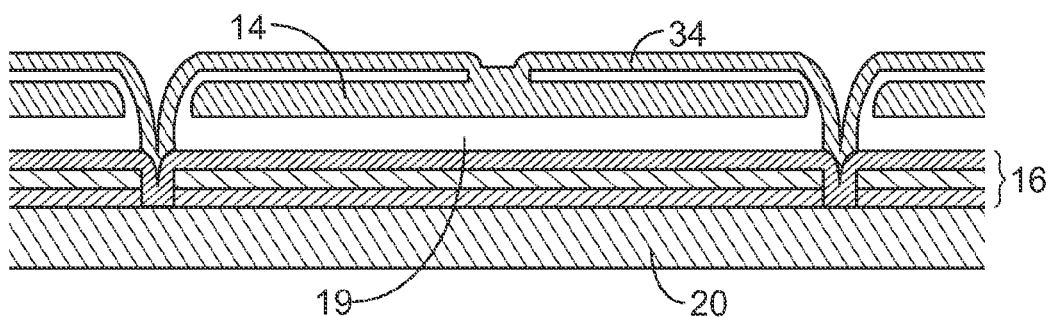

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the movable reflective layer 14 and those used for the deformable layer 34 to be optimized independently of one another.

Figure 6D:
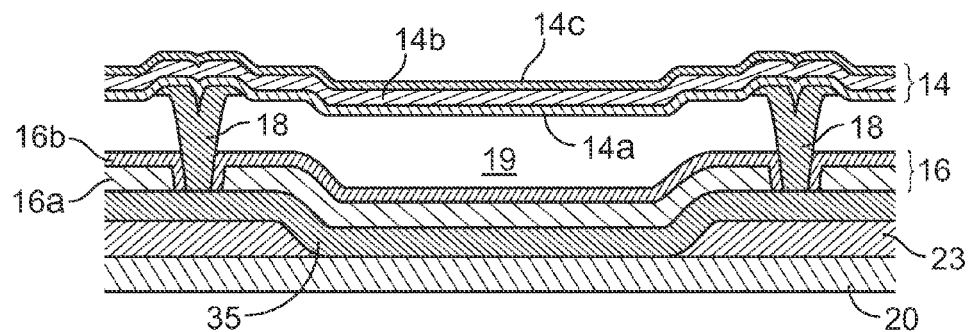

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., a portion of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, e.g., an aluminum (Al) alloy with about 0.5% copper (Cu), or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, a silicon dioxide (SiO$_2$) layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, carbon tetrafluoromethane (CF$_4$) and/or oxygen (O$_2$) for the MoCr and SiO$_2$ layers and chlorine (Cl$_2$) and/or boron trichloride (BCl$_3$) for the aluminum alloy layer. In some implementations, the black mask 23 can be an etalon or interferometric stack structure. In such interferometric stack black mask structures 23, the conductive reflectors can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
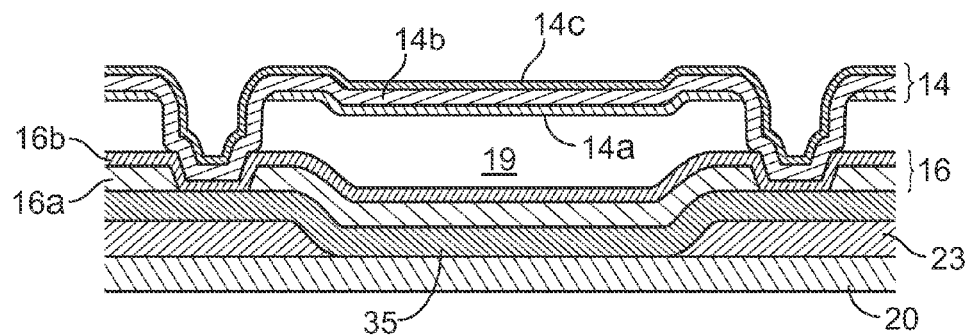

FIG. 6E shows another example of an IMOD, where the movable reflective layer 14 is self supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as, e.g., patterning.

Figure 7:
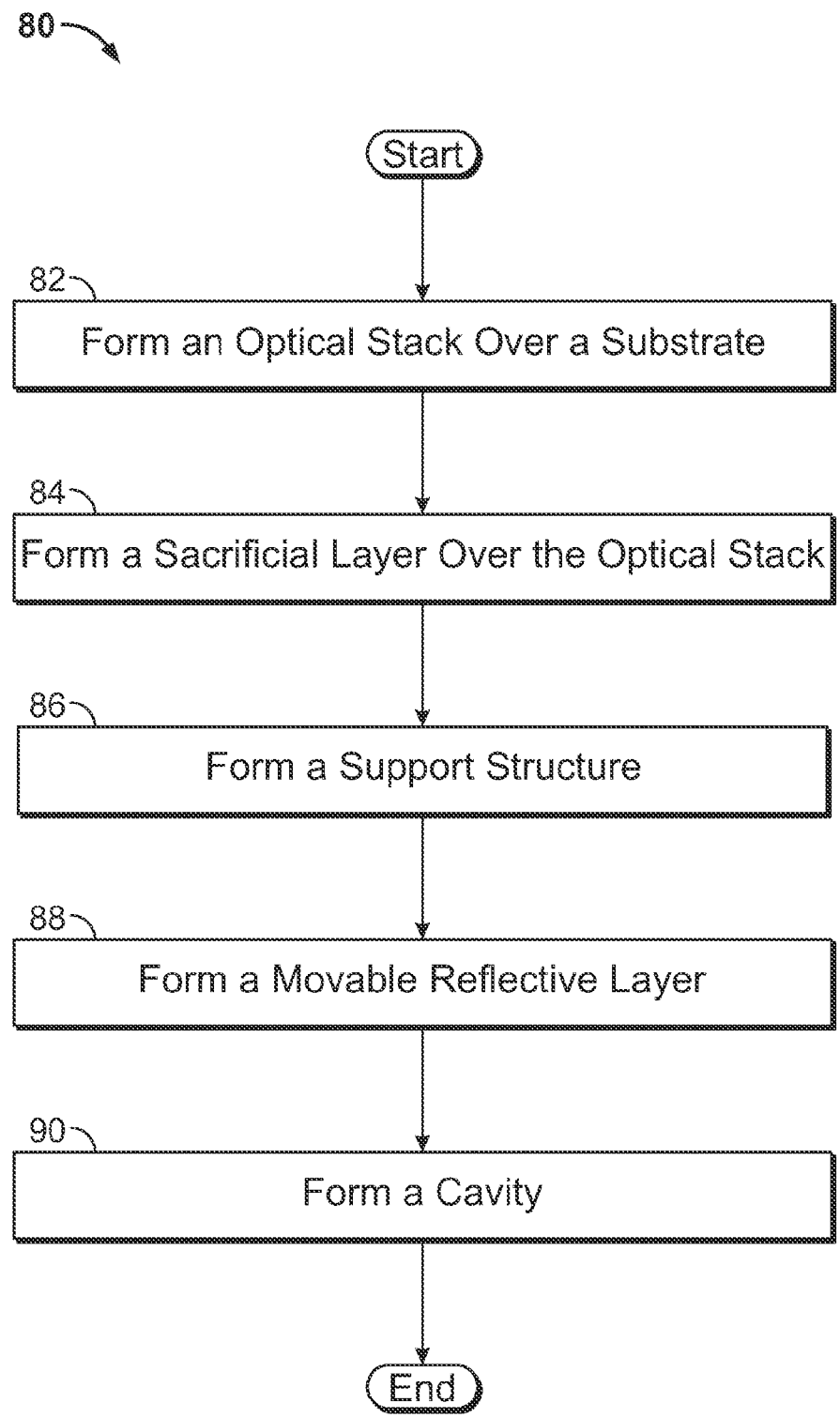
FIG. 7 shows an example of a flow diagram illustrating a manufacturing process for an interferometric modulator.
Figure 8A:
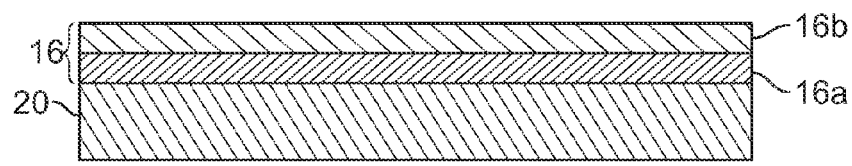
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture, e.g., interferometric modulators of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
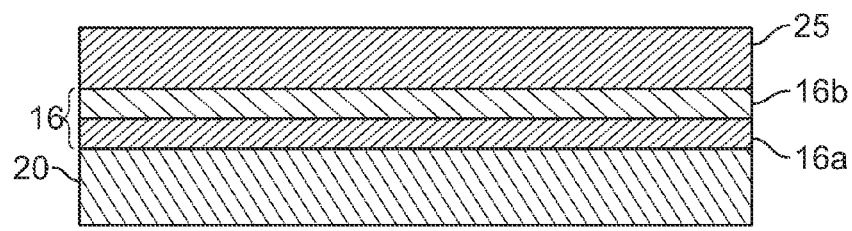

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride (XeF$_2$)-etchable material such as molybdenum (Mo) or amorphous silicon (Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
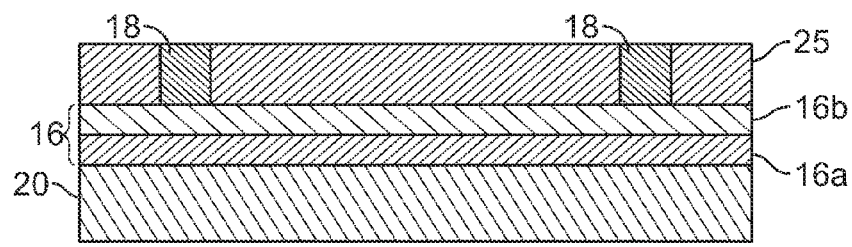

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning to remove portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
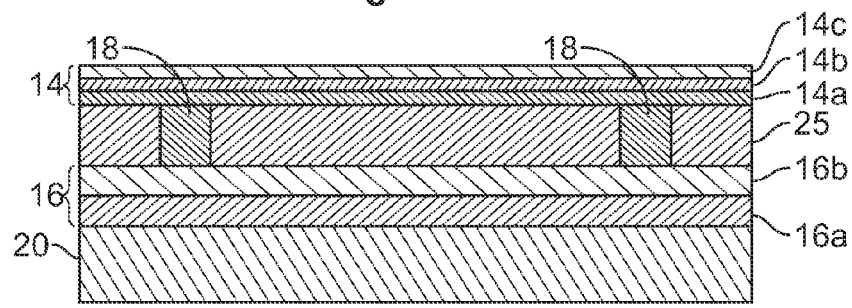
Figure 8E:
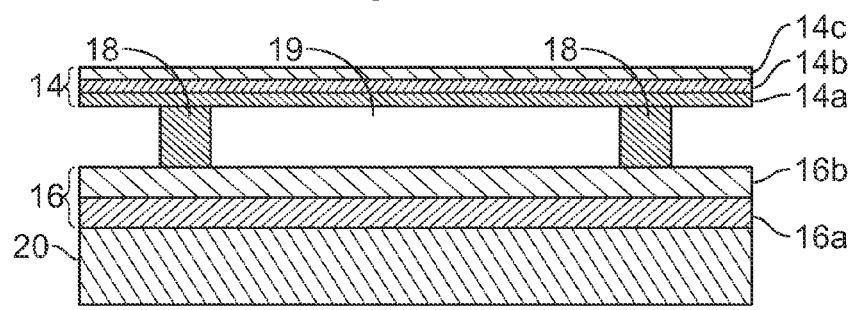

The process 80 continues at block 88 with the formation of a movable reflective layer or membrane such as the movable reflective layer 14 illustrated in FIGS. 1, 6 and 8D. The movable reflective layer 14 may be formed by employing one or more deposition steps, e.g., reflective layer (e.g., aluminum, aluminum alloy) deposition, along with one or more patterning, masking, and/or etching steps. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 also may be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as molybdenum (Mo) or amorphous silicon (a-Si) may be removed by dry chemical etching, e.g., by exposing the sacrificial layer 25 to a gaseous or vaporous etchant, such as vapors derived from solid xenon difluoride ($XeF_2$) for a period of time that is effective to remove the desired amount of material, typically selectively removed relative to the structures surrounding the cavity 19. Other etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

Electromechanical devices having improved fill factor are disclosed. In some implementations, the electromechanical device can be an interferometric device including a pixel array and a mechanical layer that is anchored over an optical stack at each corner of each pixel. A via can be provided in a pixel of the array to electrically connect a stationary electrode to the black mask at a corner of the pixel. The via can be offset from where the mechanical layer is anchored over the optical stack at the corner of the pixel in an optically non-active area of the pixel. Offsetting the via can reduce the area of the black mask relative to a design in which the via overlaps with an anchoring hole used to anchor the mechanical layer over the optical stack, and thus the offset via can be employed in a pixel array to improve fill factor. For example, offsetting the via from the anchor hole can reduce the size of the anchor hole, thereby permitting the area of the black mask at pixel corners to be decreased. Thus, offsetting the via from the anchor hole can increase fill factor by reducing black mask area, thereby improving fill factor by increasing the ratio of optically active area in the pixel array relative to the total area of the array. In some implementations, the via is provided for only some of the pixels (or a fraction of the pixels), thereby further improving fill factor of the pixel array. For example, the via can only be provided at a corner of a pixel with the largest gap size.

Figure 9:
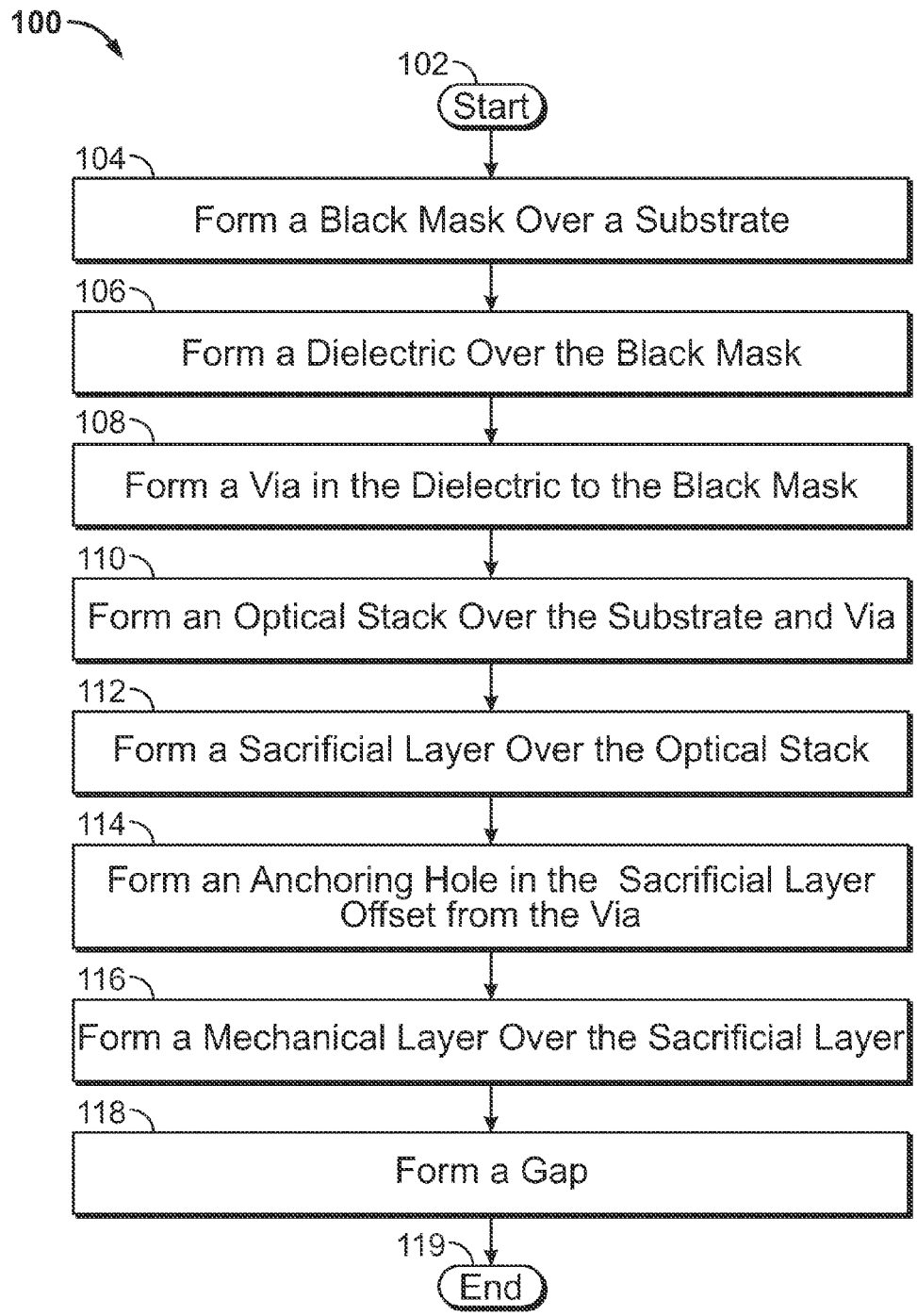
FIG. 9 shows an example of a flow diagram illustrating a manufacturing process for an interferometric modulator.

FIG. 9 shows an example of a flow diagram illustrating a manufacturing process 100 for an interferometric modulator. The process 100 starts at a block 102. In a block 104, a black mask is formed over a substrate. The substrate can be, for example, a transparent substrate including glass or plastic. The black mask can include a variety of materials and/or layers, including glass or a transparent polymeric material which permits images to be viewed through the substrate.

With continuing reference to FIG. 9, the black mask structure can be configured to absorb ambient or stray light in optically inactive regions, such as regions between pixels and/or regions near pixel corners where the mechanical layer bends so as to improve the optical properties of a display device. Additionally, the black mask structure can be conductive and be configured to function as an electrical bussing layer. The black mask structure can include a plurality of layers, as described above.

In a block 106, a dielectric layer is provided over the black mask. The dielectric layer can be used to electrically isolate portions of the black mask from one or more subsequently deposited layers. The dielectric layer can be any suitable electrical insulator, including, for example, silicon dioxide ($SiO_2$), silicon oxynitride (SiON) and/or tetraethyl orthosilicate (TEOS).

The process 100 illustrated in FIG. 9 continues at a block 108, in which a via is formed in the dielectric layer to the black mask. The via can permit a subsequently deposited layer to contact the black mask to aid in providing, for example, electrical connections for rows in the interferometric modulator array. As will be described in further detail below, vias need not be included for each pixel of the interferometric modulator array. Rather, vias can be provided only for a portion of the pixels of the array to aid in increasing fill factor.

In a block 110, an optical stack is formed over the dielectric layer and via. The optical stack includes a stationary electrode, and the portion of the optical stack provided over the via can be used to make electrical connections between the stationary electrode and the black mask.

The process 100 illustrated in FIG. 9 continues to a block 112, in which a sacrificial layer is formed over the optical stack. The sacrificial layer is later removed to form a gap. The formation of the sacrificial layer over the optical stack may include deposition of a fluorine-etchable material such as molybdenum (Mo) or amorphous silicon (a-Si), in a thickness selected to provide, after subsequent removal, a gap having the desired size. Multiple sacrificial layers can be deposited to achieve a plurality of gap sizes. For example, for an IMOD array, each gap size can represent a different reflected color.

In a block 114, an anchoring hole is formed in the sacrificial layer that is offset from the via. The anchoring hole can be formed by removing a portion of the sacrificial layer near a corner of a pixel. The anchoring hole can used to form a post for supporting a subsequently deposited mechanical layer and/or to permit a self-supporting mechanical layer to contact the optical stack and/or another layer, as will be described in detail below. The anchoring hole formed in block 114 is not aligned with the via formed in block 110. Rather, the anchoring hole and via are offset, thereby permitting the anchoring hole to have dimensions which are smaller relative to a scheme in which the via and the anchoring hole overlap, since the anchoring hole need not include additional margin to account for alignment with the via. Reducing the dimensions of the anchoring hole can aid in improving fill factor of the interferometric modulator array, since reducing the size of the anchoring hole permits the area of the optically non-active black mask disposed at the pixel corner to be decreased.

The process 100 illustrated in FIG. 9 continues at a block 116 with the formation of a mechanical layer. The mechanical layer can be formed by employing one or more deposition steps, along with one or more patterning, masking, and/or etching steps, as was described earlier.

The process 100 illustrated in FIG. 9 continues at a block 118 with the formation of a cavity or gap. The gap may be formed by exposing the sacrificial material, such as the sacrificial material deposited at the block 112, to an etchant. For example, an etchable sacrificial material such as molybdenum (Mo), tungsten (W), tantalum (Ta) or polycrystalline silicon (poly-Si) or amorphous silicon (a-Si) may be removed by dry chemical etching.

After the sacrificial layer is removed, the mechanical layer is typically released and can be moved by electrostatic forces between an actuated and a relaxed position by application of a voltage between the stationary electrode and the mechanical layer. The mechanical layer can be anchored at the corner of a pixel to the optical stack over a portion of the black mask formed in the block 104.

The process 100 illustrated in FIG. 9 ends at a block 119. Additional details of the method can be as described below. Many additional steps may be employed before, in the middle of, or after the illustrated sequence, but are omitted for clarity.

Figure 10E:
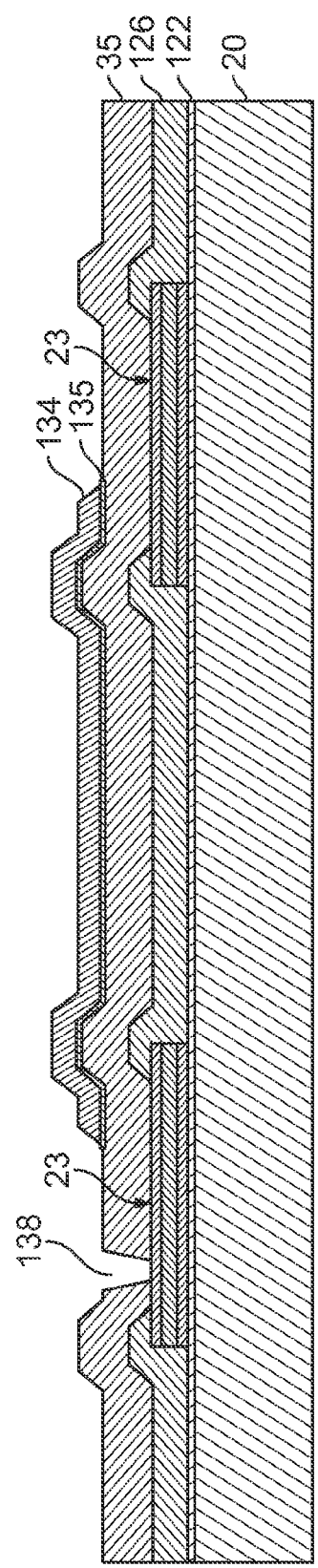
FIGS. 10A-10R show examples of cross-sectional schematic illustrations of various stages in a method of making an interferometric modulator.
Figure 10F:
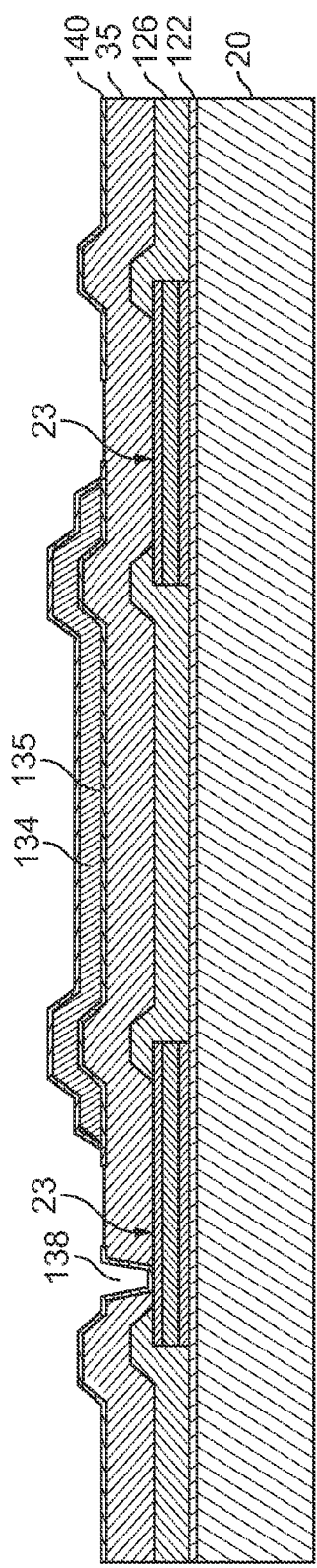
Figure 10G:
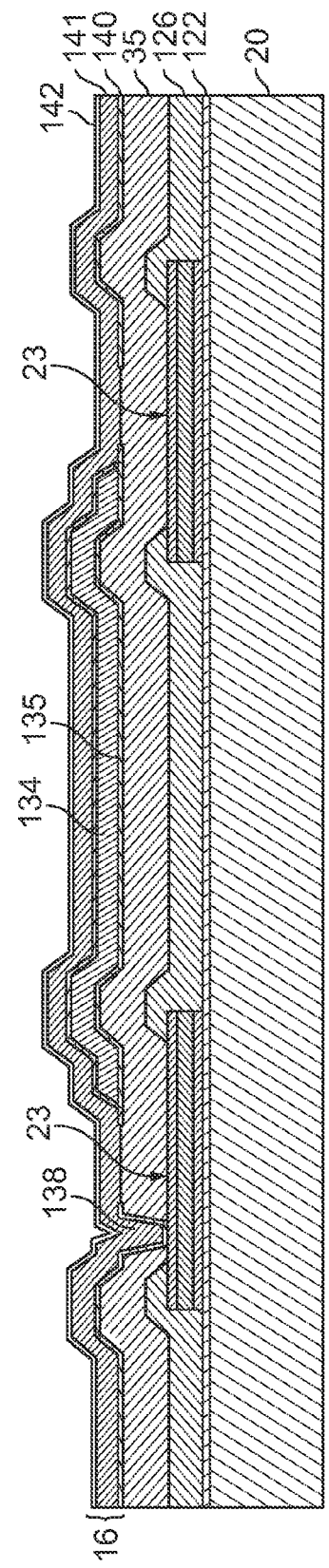
Figure 10L:
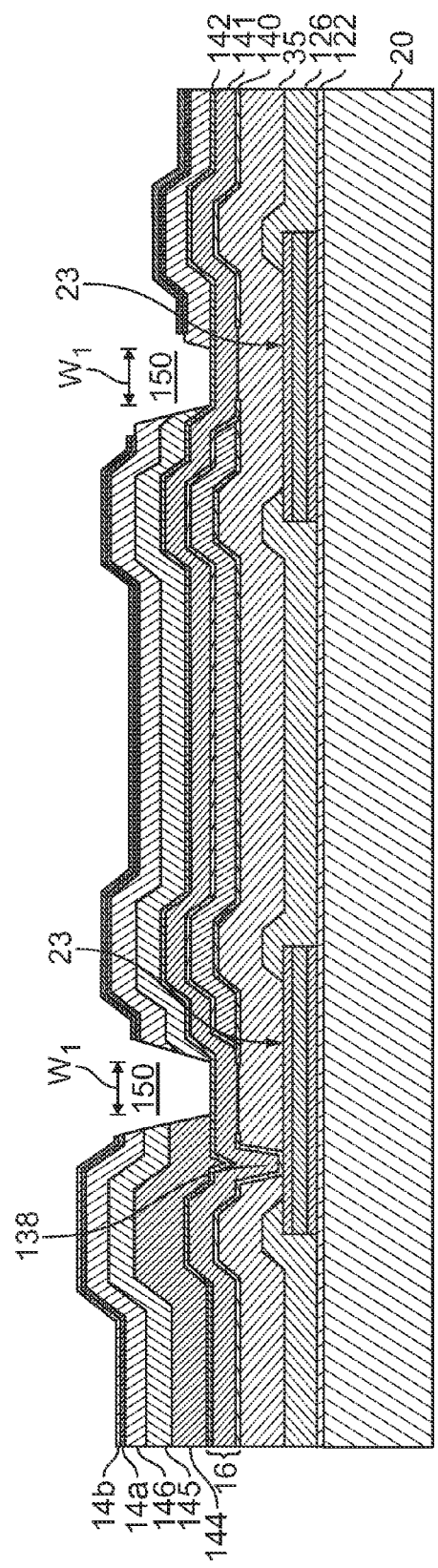
Figure 10M:
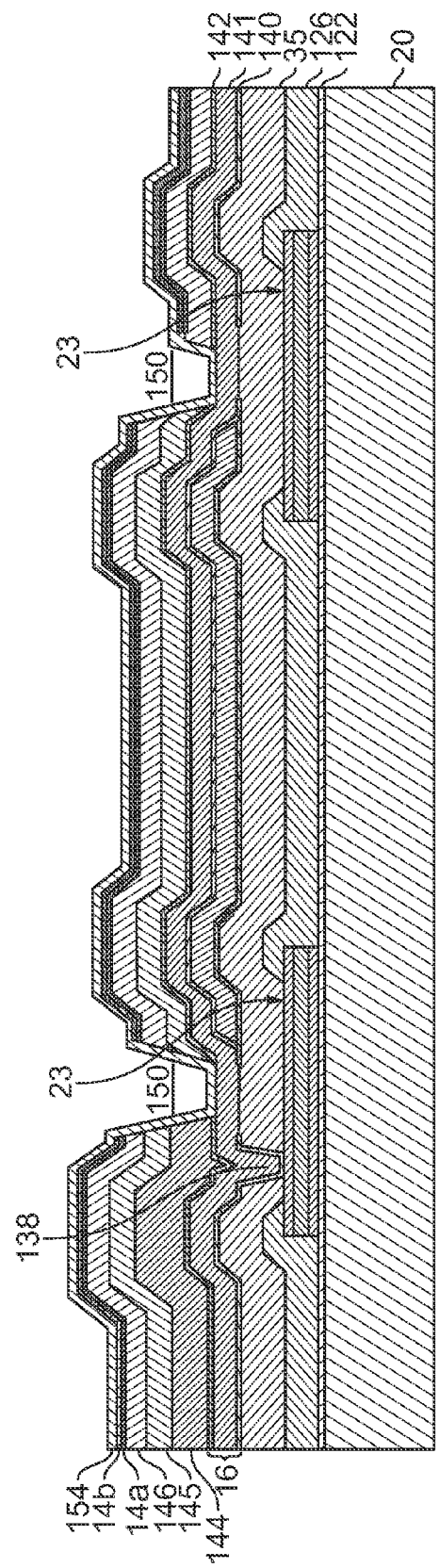
Figure 10N:
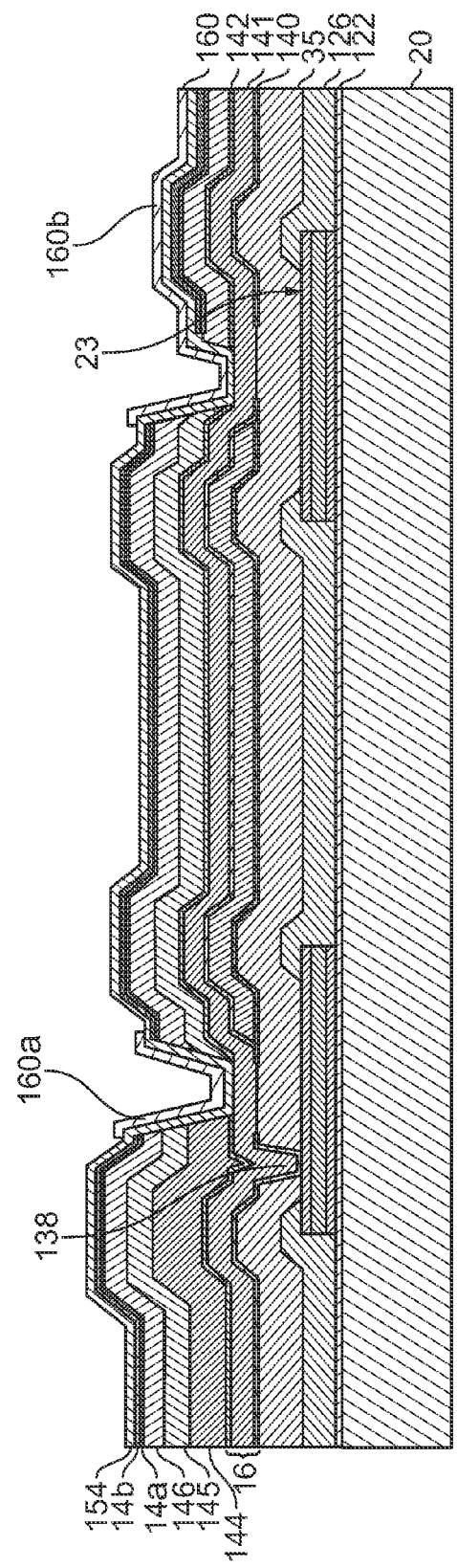
Figure 10O:
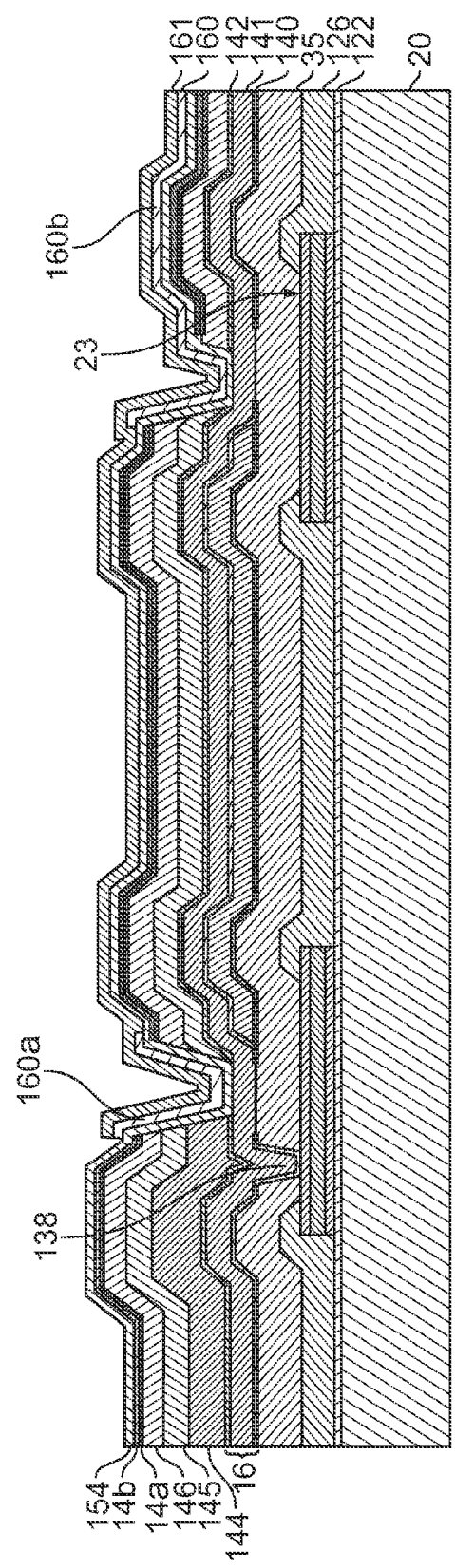
Figure 10P:
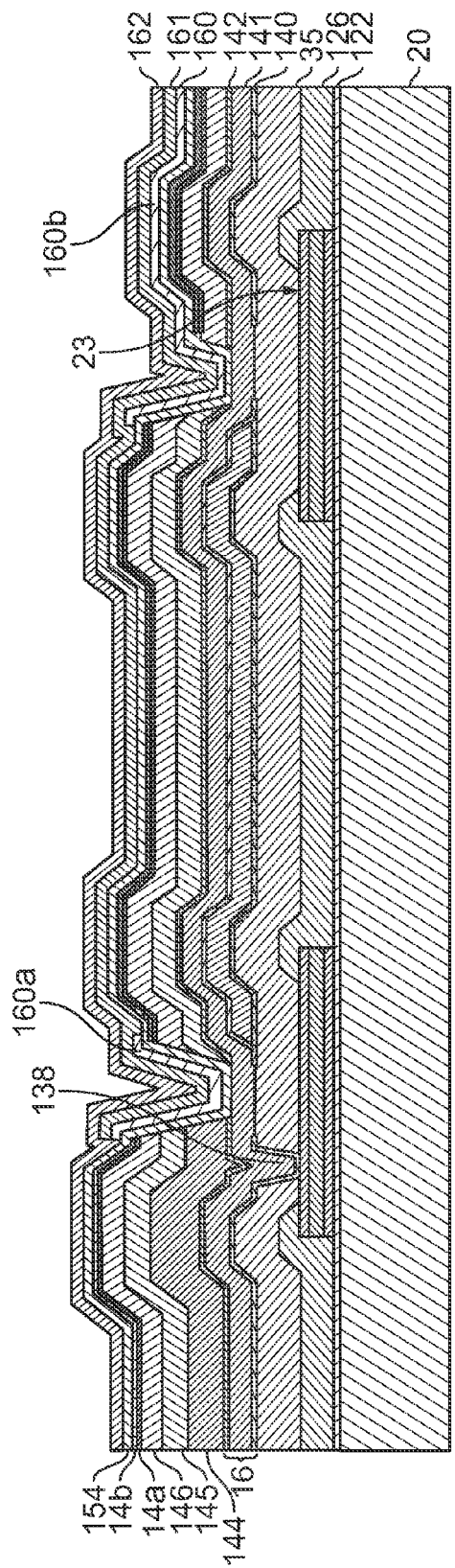
Figure 10Q:
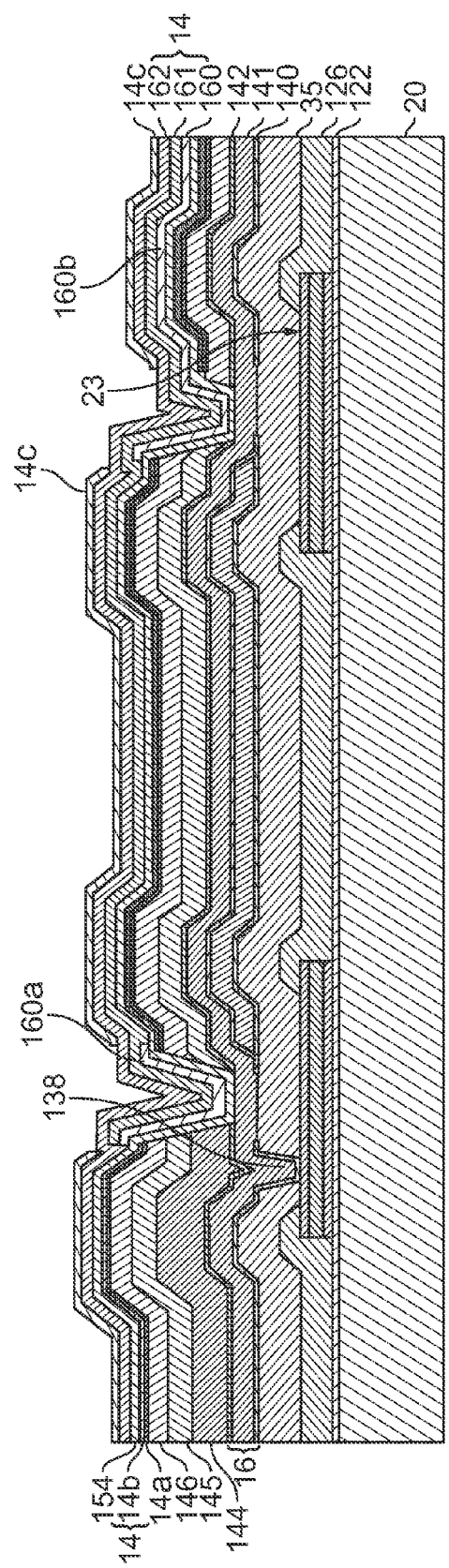
Figure 10R:
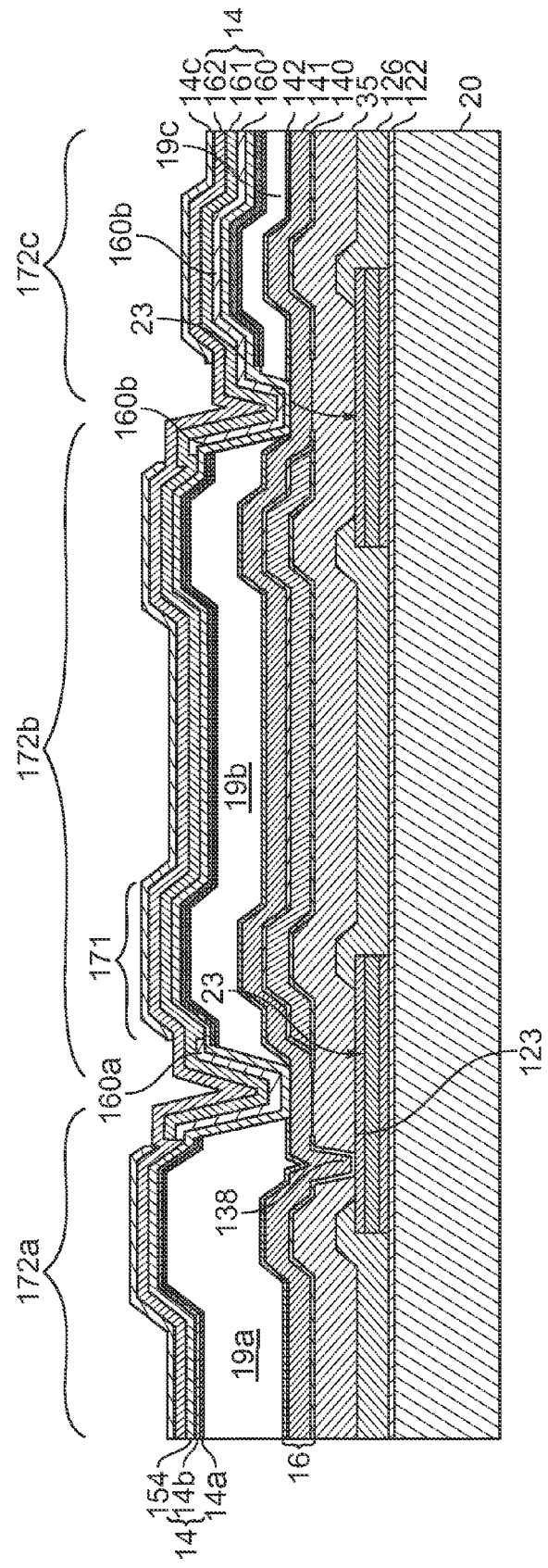

FIGS. 10A-10R show examples of cross-sectional schematic illustrations of various stages in a method of making an interferometric modulator. In FIG. 10A, a black mask structure 23 has been provided over a substrate 20. The substrate 20 can include a variety of transparent materials, as was described above. One or more layers can be provided on the substrate before providing the black mask structure 23. For example, as shown in FIG. 10A, an etch-stop layer 122 has been provided before providing the black mask structure 23 to serve as an etch-stop when patterning the black mask. In some implementations, the etch-stop layer 122 is an aluminum oxide layer having a thickness in the range of about 50-250 Å, for example, about 160 Å.

The black mask structure 23 can be configured to absorb ambient or stray light in optically inactive regions (e.g., between pixels) to improve the optical properties of a display device by increasing the contrast ratio. Additionally, the black mask structure 23 can be conductive and be configured to function as an electrical bussing layer.

With continuing reference to FIG. 10A, the black mask structure 23 can include one or more layers. In some implementations, the black mask structure 23 includes an optical absorber layer 23a, a dielectric layer 23b, and a bussing layer 23c. In some implementations, a MoCr layer serves as the optical absorber layer 23a, a $SiO_2$ layer serves as the dielectric layer 23b, and an aluminum alloy layer serves as the bussing layer 23c, with a thickness in the range of, for example, about 30-80 Å, 500-1000 Å, and 500-6000 Å, respectively.

FIG. 10B illustrates providing a shaping structure 126 over the substrate 20. The shaping structure 126 can include a buffer oxide layer, such as silicon dioxide ($SiO_2$). The shaping structure 126 can have, for example, a thickness in the range of about 500-6000 Å. The shaping structure 126 can aid in maintaining a relatively planar profile across the substrate by filling in gaps between bussing or black mask structures 23. However, the shaping structure 126 can overlap a portion of the black mask structure 23 to aid in forming a kink in the mechanical layer, as will be described in detail later below. In particular, one or more layers, including the mechanical layer, can be deposited over the shaping structure 126, thereby substantially replicating one or more geometric features of the shaping structure 126. For example, as illustrated in FIG. 10B, the shaping structure 126 can overlap the black mask structure 23 to form a protrusion 129, which can produce an upwardly extending wave or kink in a subsequently deposited conformal layer, such as a mechanical layer.

Although various electromechanical systems devices illustrated herein are shown and described as including the shaping structure 126, persons having ordinary skill in the art will recognize that the methods of forming a mechanical layer as described herein can be applicable to processes lacking the shaping structure 126.

FIG. 10C illustrates providing a spacer or dielectric layer 35. The dielectric layer 35 can include, for example, silicon dioxide ($SiO_2$), silicon oxynitride (SiON), and/or tetraethyl orthosilicate (TEOS). In some implementations, the thickness of the dielectric layer 35 is in the range of about 3000-6000 Å, however, the dielectric layer 35 can have a variety of thicknesses depending on desired optical properties. The dielectric layer 35 can be removed over a portion above the black mask structure 23 ("above" here referring to the side of the black mask structure 23 opposite the substrate 20), so as to permit formation of a via for electrically connecting a stationary electrode to the black mask structure 23, as will be described in further detail below with reference to FIGS. 10E and 10F.

FIG. 10D illustrates providing a color enhancement structure 134 over the dielectric layer 35. The color enhancement structure 134 can be selectively provided over various pixel structures. For example, in a multi-color interferometric modulator implementation employing multiple gap heights, the color enhancement structure 134 can be provided over modulators having a particular gap size. In some implementations, the color enhancement structure 134 is a silicon oxynitride (SiON) layer having a thickness ranging between about 1500 Å to about 2500 Å, for example, about 1900 Å. The SiON layer can be patterned using any suitable technique, including, for example, an etch process employing tetrafluoromethane ($CF_4$) and/or oxygen ($O_2$).

One or more layers can be provided on the dielectric layer 35 before providing the color enhancement structure 134. For example, as shown in FIG. 10D, an etch-stop layer 135 has been provided before providing the color enhancement layer 134. In some implementations, the etch stop layer 135 is an aluminum oxide layer having a thickness in the range of about 50-250 Å, for example, about 160 Å.

FIG. 10E illustrates forming a via 138 in the dielectric layer 35. The via 138 can permit a subsequently deposited layer to contact the black mask structure 23, as will be described in detail below. As shown in FIG. 10E, vias need not be included over each region of the black mask 23. Rather, vias can be placed periodically in the interferometric modulator so as to increase the fill factor of the array.

FIGS. 10F and 10G illustrate forming an optical stack 16 over the dielectric layer 35 and the via 138. The optical stack 16 can include a plurality of layers. For example, the optical stack 16 can include a stationary electrode layer 140, such as molybdenum-chromium (MoCr), a transparent dielectric layer 141, such as silicon dioxide ($SiO_2$), and an etch-stop layer 142, such as aluminum oxide ($AlO_x$), for protecting the transparent dielectric layer 141 during subsequent sacrificial layer etch processes and/or attack during sacrificial layer removal processes. The etch-stop layer 142 can be formed from a variety of materials that are partially reflective such as various metals, semiconductors, and dielectrics. The partially reflective layer can be formed of one or more sub-layers, and each of the sub-layers can be formed of a single material or a combination of materials. In some implementations, some or all of the layers of the optical stack 16, including, for example, the stationary electrode 140, are patterned into parallel strips, and may form row electrodes in a display device. As illustrated in FIGS. 10F and 10G, one or more layers of the optical stack 16 may physically and electrically contact the black mask structure 23. For example, the via 138 permits the stationary electrode 140 to electrically contact the black mask structure 23.

FIGS. 10H-10J illustrate providing and patterning a plurality of sacrificial layers over the optical stack 16. The sacrificial layers are later removed to form a gap or cavity, as will be discussed below. The use of a plurality of sacrificial layers can aid in the formation of a display device having a multitude of resonant optical gaps. For example, as illustrated, various gap sizes can be created by selectively providing a first sacrificial layer 144, a second sacrificial layer 145, and a third sacrificial layer 146. This can provide a first gap size (or "high gap") equal to about a sum of the thicknesses of the first, second and third sacrificial layers 144-146, a second gap size (or "mid gap") equal to about a sum of the thicknesses of the second and third sacrificial layers 145, 146, and a third gap size (or "low gap") equal to about the thickness of the third sacrificial layer 146. For an interferometric modulator array, a high gap can correspond to a high gap pixel, a mid gap can correspond to a mid gap pixel, and a low gap can correspond to a low gap pixel. Each of these pixels that are configured with different gap size can produce a different reflected color. Accordingly, such pixels may be referred to herein as high, mid, or low gap pixels.

The formation of the first, second and third sacrificial layers 144-146 over the optical stack 16 may include deposition of molybdenum (Mo) or amorphous silicon (a-Si). In some implementations, the first sacrificial layer 144 is a molybdenum (Mo) layer having a thickness ranging between about 200 Å to about 1,000 Å, for example, about 400 Å, the second sacrificial layer 145 is a Mo layer having a thickness ranging between about 200 Å to about 1,000 Å, for example, about 400 Å, and the third sacrificial layer 146 is a Mo layer having a thickness ranging between about 600 Å to about 2,000 Å, for example, about 1,600 Å.

Although FIGS. 10H-10J are illustrated for a configuration in which the second sacrificial layer 145 is provided over the first sacrificial layer 144 and the third sacrificial layer 146 is provided over the first and second sacrificial layers 144, 145, other configurations are possible. For example, the first, second and third sacrificial layers 144-146 need not overlap, and more or fewer sacrificial layers can be formed to provide desired gap sizes.

FIG. 10K illustrates patterning the sacrificial layers 144-146 between pixels. The sacrificial layers can be patterned in a variety of ways, including using an etchant, such as chlorine ($Cl_2$) and/or oxygen ($O_2$). The portion of the sacrificial layers 144-146 removed between pixels, such as at the corners of pixels, can create anchor holes 150, which can be used to form a post for supporting a subsequently deposited mechanical layer and/or to aid in anchoring a self-supporting mechanical layer, as will be described below.

The anchor holes 150 of the illustrated partially fabricated interferometric modulator are not aligned with the via 138. This can permit the anchor hole 150 to have a width $w_1$ which is smaller relative to a scheme in which the via 138 and the anchor hole 150 overlap to form an anchor via, since the anchor hole 150 need not include additional margin to account for alignment with via 138. Additionally, by offsetting the via 138 and the anchor hole 150, non-uniformity across pixels related to anchor hole and via misalignment can be avoided.

Furthermore, as illustrated in FIG. 10L, in some implementations the via 138 need not be included over each region of the black mask 23. Rather, vias can be periodically provided over less than all of the pixels of an array. By reducing the width $w_1$ of the anchor hole 150 and by reducing the total number of vias 138 in the interferometric modulator array, the total area of the black mask 23 can be reduced, thereby improving the fill factor.

FIG. 10L illustrates providing and patterning a reflective layer 14a and a support layer 14b of a mechanical layer. The reflective layer 14a can be a reflective material including, for example, aluminum alloys. In some implementations, the reflective layer 14a includes aluminum-copper (AlCu) having copper by weight in the range of about 0.3% to 1.0%, for example, about 0.5%. The reflective layer 14a can be any suitable thickness, such as a thickness in the range of about 200 Å to about 500 Å, for example, about 300 Å.

The support layer 14b can be used to assist a photolithography process by serving as an antireflection layer and/or to aid in obtaining a desired mechanical flexibility of a fully fabricated mechanical layer. In some implementations, the support layer 14b is a silicon oxynitride (SiON) layer having a thickness in the range of about 50 Å to about 1,000 Å, for example, about 250 Å.

FIG. 10M illustrates providing an etch-stop layer 154 over the support layer 14b, over the transparent dielectric layer 141 on the bottom of anchor holes 150, and over the sacrificial layers 144-146 on the sidewalls of the anchor holes 150. The etch-stop layer 154 can be, for instance, an aluminum oxide ($AlO_x$) layer having a thickness in the range of about 100 Å to about 300 Å, for example, 200 Å. The etch-stop layer 154 can be employed to protect layers of the interferometric device from subsequent etching steps. For example, as will be described later below, when the sacrificial layers 144-146 are removed to release the mechanical layer, the etch-stop layer 154 can protect support layers from an etchant used to remove the sacrificial layers 144-146.

FIGS. 10N-10P illustrate providing and patterning a first support layer 160, a second support layer 161, and a third support layer 162. The first, second, and third support layers 160-162 can be used for a variety of functions. For example, the first, second, and third support layers 160-162 can be used to form support structures, including posts and/or rivets. Furthermore, the first, second, and third support layers 160-162 can be incorporated into all or part of the mechanical layer to aid in achieving a structural rigidity corresponding to a desired actuation voltage and/or to aid in obtaining a self-supporting mechanical layer.

As illustrated in FIG. 10P, a portion 160a of the first support layer 160 can serve as a support post for a high gap pixel and a mid gap pixel, while a portion 160b of the first support layer 160 can be included in the mechanical layer of a low gap pixel. By employing the first, second and third support layers 160-162 to serve a variety of functions across pixels of varying gap heights, flexibility in the design of the interferometric device can be improved. In some implementations, the mechanical layer can be self-supporting over certain pixels and can be supported by a support post or other structures over other pixels.

The sacrificial layers 144-146 can be later removed to form various pixels in the interferometric modulator array. The thickness of the mechanical layer formed above the sacrificial layers can be varied by selectively including the first, second and third support layers 160-162 in the mechanical layer over various pixels of the array. For example, the third support layer 162 can be provided over high gap, mid gap and low gap pixels, the second support layer 161 can be provided over mid and low gap pixels, and the first support layer 160 can be provided over low gap pixels. By varying the thickness of the mechanical layer across pixels of different gap heights, the desired stiffness of the mechanical layer can be achieved for each gap height, which can aid in permitting the same pixel actuation voltage for different sized air-gaps for color display applications.

The first, second and third support layers 160-162 can be formed by a dielectric material, such as silicon oxynitride (SiON). In some implementations, the thickness of the first, second and third supporting layers 160-162 can each be in the range of about 600 Å to about 3,000 Å, for example, about 1,000 Å.

FIG. 10Q illustrates providing and patterning a cap layer 14c to form a completed mechanical layer 14. The cap layer 14c can be provided conformally over the supporting layers 160-162 and can have a pattern similar to that of the reflective layer 14a. Patterning the cap layer 14c similar to that of the reflective layer 14a can aid in balancing stresses in the mechanical layer 14. By balancing stresses in the mechanical layer 14, the shaping and curvature of the mechanical layer 14 upon removal of the sacrificial layers 144-146 can be controlled, as will be described below. Furthermore, balanced stresses in the mechanical layer 14 can reduce the sensitivity of gap height of a released interferometric modulator to temperature.

The cap layer 14c can be a metallic material and can be, for example, the same material as the reflective layer 14a. In some implementations, the cap layer 14c includes aluminum-copper (AlCu) having copper by weight in the range of about 0.3% to 1.0%, for example, about 0.5%, and the thickness of the cap layer 14c is selected to be in the range of about 200 Å to about 500 Å, for example, about 300 Å.

As was described above the mechanical layer 14 can include a variety of layers across different pixels of the interferometric modulator array. Additional details of the mechanical layer 14 can be as described below.

FIG. 10R illustrates removal of the sacrificial layers 144-146 to form a first or high gap 19a, a second or mid gap 19b, and a third or low gap 19c. Additional steps can be employed before forming first, second and third gaps 19a-19c. For example, sacrificial release holes can be formed in the mechanical layer 14 to aid in removing the sacrificial layers 144-146.

The gaps 19a-19c can be formed by exposing the sacrificial layers 144-146 to an etchant, as was described above. The sacrificial layer can be exposed for a period of time that is effective to remove the material, typically selectively relative to the structures surrounding the gaps 19a-19c. Other selective etching methods, for example, wet etching and/or plasma etching, also can be used.

The etch-stop layer 154 can protect the first support layer 160 from the sacrificial release chemistry used to remove the sacrificial layers 144-146. This can permit the first support layer 160 to be a structural material that would otherwise be etched by the release chemistry used to remove the sacrificial layers.

The dielectric protection layer 142 can protect layers of the optical stack 16, such as the dielectric layer 141, from the sacrificial release chemistry used to remove the sacrificial layers 144-146. Inclusion of the dielectric protection layer 142 can aid reducing or preventing damage to the optical stack during release, thereby improving optical performance.

The first, second and third gaps 19a-19c can correspond to cavities that interferometrically enhance different colors. For example, the first, second and third gaps 19a-19c can have heights selected to interferometrically enhance, for example, blue, red, and green, respectively. The first or high gap 19a can be associated with a first or high gap pixel 172a, the second or mid gap 19b can be associated with a second or mid gap pixel 172b, and the third or low gap 19c can be associated with a third or low gap pixel 172c.

In order to permit approximately the same actuation voltage to collapse the mechanical layer for each gap size, the mechanical layer 14 can include different materials, number of layers, or thicknesses over each of the gaps 19a-19c. Thus, as shown in FIG. 10R, a portion of the mechanical layer 14 over the high gap 19a can include the reflective layer 14a, the support layer 14b, the etch-stop layer 154, the third support layer 162 and the cap layer 14c, while a portion of the mechanical layer 14 over the mid gap 19b can further include the second support layer 161. Similarly, in contrast to the portion of the mechanical layer 14 over the high gap 19a, a portion of the mechanical layer 14 over the low gap 19c can further include the first and second support layers 160, 161.

As described above, the first, second and third support layers 160-162 can serve different functions across different pixels of the interferometric modulator array. For example, the first support layer 160 can be used for supporting the mechanical layer 14 over high and mid gap pixels and for increasing the structural rigidity of low gap pixels. Additionally, the second support layer 161 can be used for supporting the mechanical layer 14 over high gap pixels and for increasing the structural rigidity of mid gap pixels, and the third support layer can be used for increasing the structural rigidity of low, mid and high gap pixels. Thus, the first portion 160a of the first support layer 160 serves as a post for supporting the mechanical layer 14 over the high and mid gaps 19a, 19b, while the second portion 160b of the first support layer 160 is included in the mechanical layer 14 over the low gap 19c. Using a plurality of support layers permits approximately the same actuation voltage to collapse the mechanical layer for each gap size.

After removal of the sacrificial layers 144-146, the mechanical layer 14 can become displaced away from the substrate by a launch height and can change shape or curvature at this point for a variety of reasons, such as residual mechanical stresses. As described above, the cap layer 14c can be used with the reflective layer 14a to aid in balancing the stresses in the mechanical layer when released. Thus, the cap layer 14c can have a thickness, composition, and/or stress selected to aid in tuning the launch and curvature of the mechanical layer upon removal of the sacrificial layers 144-146. Additionally, providing the mechanical layer 14 over the shaping structure 126, and particularly over the protrusion 129 of FIG. 10B, a kink 171 is formed in the mechanical layer 14. The geometric features of the kink 171 can be controlled by varying the thickness of the shaping structure 126, thereby controlling the stresses in the mechanical layer 14. Control of the launch height can allow the selection of a sacrificial layer thickness needed for a particular gap size which is desirable from a fabrication and optical performance standpoint.

As was described above, the anchor holes 150 of FIG. 10K are not aligned with the via 138. Thus, as shown in FIG. 10R, the mechanical layer 14 is anchored to the optical stack 16 over the black mask 23 at a point offset from the via 138. As described above, anchoring the mechanical layer 14 at a point offset from the via 138 can permit the black mask 23 to be smaller relative to a design in which the mechanical layer 14 is anchored over the black mask 23 in the same region as the via is located. For example, by offsetting the via 138 from an anchoring hole used to anchor the mechanical layer 14, the size of the anchor hole need not have increased area to account for process alignment with the via 138. Additionally, by offsetting the via 138 from the anchor hole used to secure the mechanical layer 14, non-uniformity across pixels related to anchor hole and via misalignment can be avoided. Thus, by offsetting the via 138 from the anchor hole fill factor of the interferometric modulator array can be improved.

Furthermore, as illustrated in FIG. 10R, the via 138 need not be included in each pixel. Rather, the vias can be provided over less than all of the pixels of an array. For example, as shown in FIG. 10R, the via 138 has been included near a corner 123 of the high gap pixel 172a. Furthermore, vias have not been included at corners of mid gap pixel 172b or low gap pixel 172c. By providing vias for less than all of the pixels of the array, the total number of vias in the interferometric modulator array can be reduced, which in turn can reduce the total area of the black mask 23. Since the black mask 23 is optically opaque, reducing the total area of the black mask 23 improves the fill factor of the pixel array.

As illustrated in FIG. 10R, the black mask 23 has a footprint larger than the footprint of the structures used to support the mechanical layer 14. For example, the portion 160a of the first support layer 160 operates as a support post for the portion of the mechanical layer 14 associated with the high gap pixel 172a, and has a width less than that of the black mask 23 at the corner 123 of the high gap pixel 172a. The additional width of the black mask 23 around the anchoring region of the mechanical layer can mask a bending portion of the mechanical layer 14 during actuation. For example, when the mechanical layer 14 is actuated, while most of the mechanical layer 14 can be aligned in a plane and can be in contact with the optical stack 16, a portion of the mechanical layer 14 (e.g., along edges of a pixel) may not be in contact with the optical stack 16, and thus can interferometrically produce an undesired color if additional black mask is not provided. The portion of the mechanical layer 14 out of contact with the optical stack 16 during actuation can increase for pixels having larger gap heights. For example, the bending region of the high gap pixel 172a can be greater than that of the low gap pixel 172c, because the gap 19a is larger than the gap 19c.

In some implementations, vias, such as the via 138, are included at one or more corners of pixels of the largest gap size. Positioning the vias 138 near corners of pixels of the largest gap size can be advantageous because high gap pixels can have a larger bending region in the actuated state, and thus can have a larger optically inactive area at pixel corners relative to mid and low gap pixels. Thus, in some implementations, the black mask can be larger at corners of high gap sub-pixels to account for the larger bending region and to provide room for a via. However, since the vias need not be included for each pixel of the array, the total area of the black mask 23 can be reduced, and the fill factor of the interferometric modulator array can be improved.

The vias, such as the via 138, can have a variety of shape and sizes. For example, the vias can be shaped as a circle, oval, octagon and/or any other suitable shape. The size of the vias can vary with process. In some implementations, each via 138 has a largest width in the range of about 1.5 μm to about 3.0 μm, for example, about 2.4 μm. Additional details of the vias can be as described below.

Figure 11A:
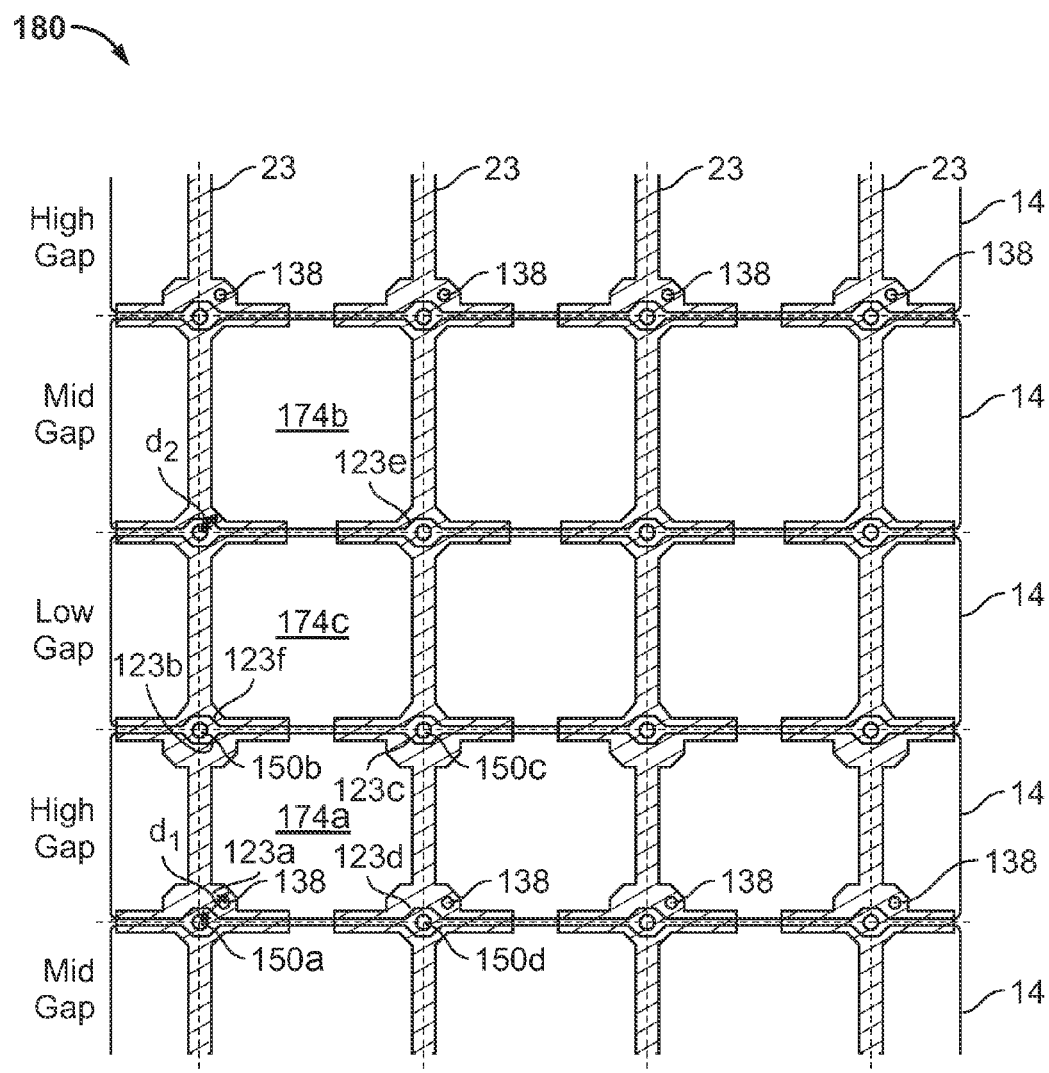
FIGS. 11A-11C show examples of plan view schematic illustrations of various interferometric modulator arrays.
Figure 11B:
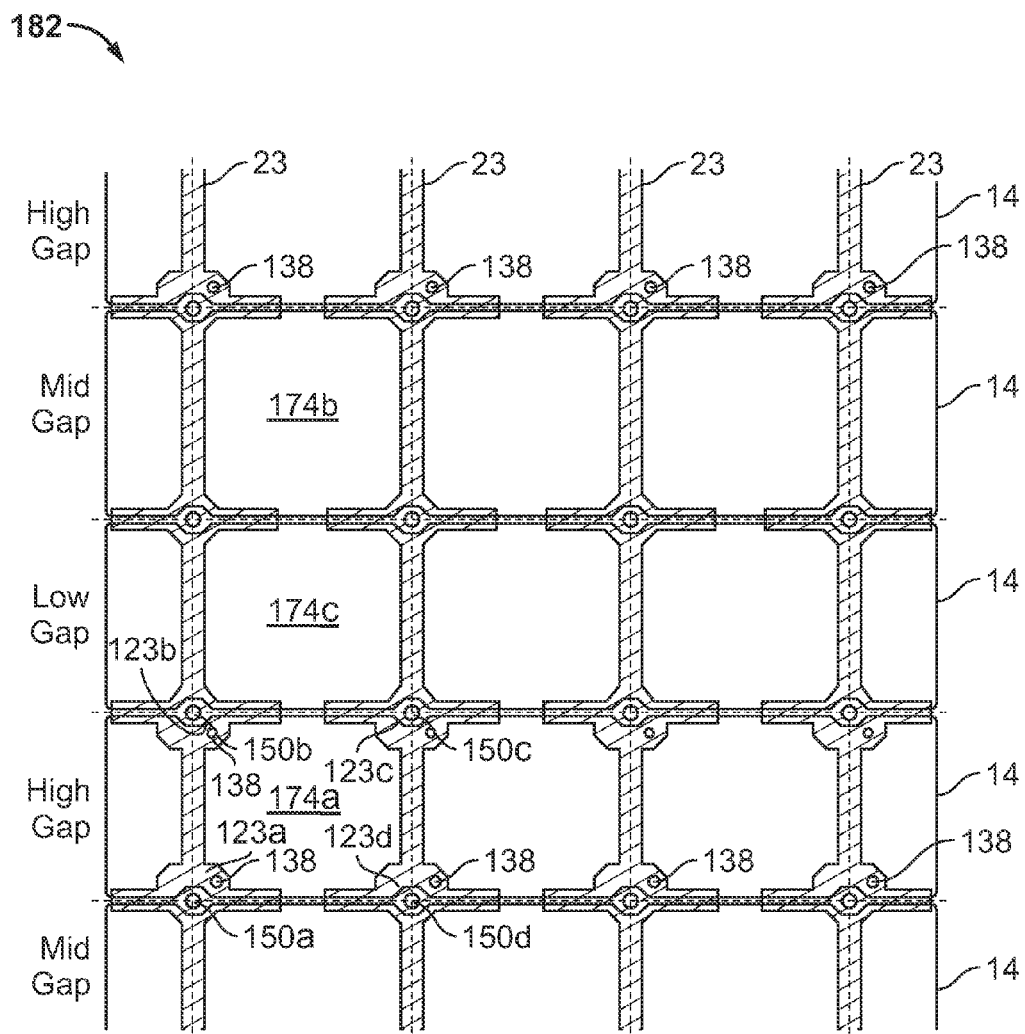
Figure 11C:
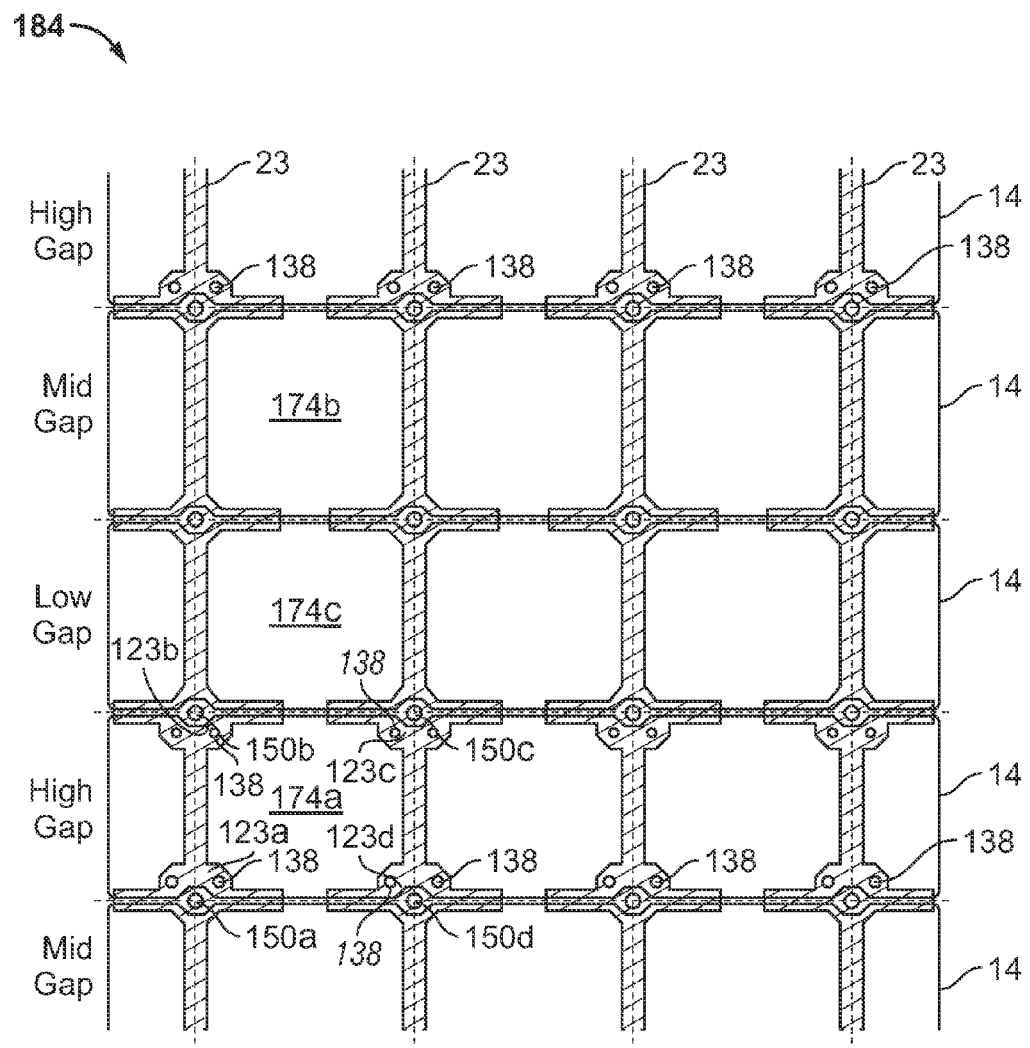

FIGS. 11A-11C show examples of plan view schematic illustrations of various interferometric modulator arrays. In FIG. 11A, an interferometric modulator array 180 is illustrated. The interferometric modulator array 180 includes a plurality of pixels of different gap sizes, including a first gap or high gap pixel 174a, a second gap or mid gap pixel 174b, and a third gap or low gap pixel 174c. The high, mid and low gap pixels 174a-174c can be similar to the high, mid, and low gap pixels 172a-172c of FIG. 10R. However, the high, mid and low gap pixels 174a-174c need not be identical to the high, mid, and low gap pixels 172a-172c.

As shown in FIG. 11A, an electrically conductive black mask is disposed on the substrate at each corner of the high, mid and low gap pixels 174a-174c. Although not illustrated in FIG. 11A, a dielectric layer has been provided over the black mask, and an optical stack including a stationary electrode has been provided over the dielectric layer. The vias 138 are used to electrically contact the stationary electrode of the optical stack to various portions of the black mask 23.

The mechanical layer 14 is positioned over the optical stack to define the gap heights of the high, mid, and low gap pixels 174a-174c. The mechanical layer 14 is anchored over the black mask 23 at each of the corners of the high, mid and low pixels 174a-174c. For example, the high gap pixel 174a includes four corners 123a-123d, and the mechanical layer is anchored over the optical stack at each of the four corners 123a, 123b, 123c, and 123d at anchoring holes 150a, 150b, 150c, and 150d, respectively. As described above, the mechanical layer 14 can be anchored over the black mask in a multitude of ways.

The area of the black mask 23 surrounding each corner of each pixel need not be the same for each pixel of the array 180. Rather, the area of black mask at a pixel corner can be larger for pixels having a relatively larger gap, such as pixels of the largest gap size, so as to account for increased mechanical layer bending during actuation. For example, the area of the black mask at each of the corners 123a-123d of the high gap pixel 174a is larger than the area of the black mask at a corner 123e of the mid gap pixel 174b and area of the black mask at a corner 123f of the low gap pixel 174c. As shown in FIG. 11A, the increased portion or bulge of the black mask at the corner 123a of the high gap pixel 174a can be used for providing the via 138.

With continuing reference to FIG. 11A, in some implementations, the via 138 is positioned at a corner of the high gap pixel 174a adjacent a mid gap pixel. However, as will be described below with reference to FIGS. 11B and 11C, the via 138 can be provided in other locations and/or at multiple corners of high gap pixels.

The distance to the edge of the black mask along a line from the center of the anchoring hole to the center of a pixel can vary depending on the gap height of the pixel. For example, the distance $d_1$ from the edge of the black mask along a line to the center of the anchoring hole of a high gap pixel can be in the range of about 10 μm to about 12 μm, while the distance $d_2$ from the edge of the black mask along a line to the center of the anchoring hole of a low or mid gap pixel can be in the range of about 7 μm to about 9 μm.

With continuing reference to FIG. 11A, the black mask 23 can be included in other regions of a pixels, such as along pixel edges, in addition to being provided at pixel corners. The black mask regions along the edges of pixels also can be used to provide electrical connections along a row or column, and can include breaks along one or more edges of each pixel to provide the desired electrical connectivity. For example, the black mask 23 includes a break along an edge bordering the high gap pixel 174a and the low gap pixel 174c. In some implementations, the breaks have a length in the range of about 2 μm to about 3 μm.

As described above, the interferometric device array 180 includes vias offset from the anchoring holes or other structures used to secure the mechanical layer 14. For example, a via 138 at the corner 123a of the high gap pixel 174a is offset from the anchor hole 150a. In some implementations, distance from the center of the via to the center of the anchoring hole to which the mechanical layer is secured ranges between about 6 μm to about 8 μm.

Offsetting the via 138 and the anchor hole can permit the anchor hole to have an area, when viewed from above, which is smaller relative to a scheme in which the via and the anchor hole overlap to form an anchor via. For example, the anchor hole 150*a* need not include additional margin to account for alignment with via 138 that is disposed at the corner 123*a* of the high gap pixel 174*a*. In some implementations, employing circular vias and circular anchor holes, the radius of the anchor hole 150*a* is in the range of about 4 μm to about 7 μm, and the radius of the via 138 is in the range of about 2 μm to about 4 μm.

In FIG. 11A, the vias are provided at one corner of each high gap pixel. For example, the high gap pixel 174*a* includes the via 138 at a first corner 123*a*, but a via has not been included at second, third and fourth corners 123*b*-123*d* of the high gap pixel 174*a*.

FIG. 11B illustrates an interferometric modulator array 182 in accordance with another implementation. The interferometric modulator array 182 of FIG. 11B is similar to the interferometric modulator array 180 of FIG. 11A, except the interferometric modulator array 182 includes vias at two corners of each high gap pixel. For example, the high gap pixel 174*a* includes vias 138 at a first corner 123*a* and at a second corner 123*b*, but a via has not been included at the third and fourth corners 123*c*, 123*d* of the high gap pixel 174*a*.

FIG. 11C illustrates an interferometric modulator array 184 in accordance with yet another implementation. The interferometric modulator array 184 of FIG. 11C is similar to the interferometric modulator array 180 of FIG. 11A, except the interferometric modulator array 184 includes vias at four corners of a high gap pixel. For example, the high gap pixel 174*a* includes vias 138 at first, second, third and fourth corners 123*a*-123*d*. Persons having ordinary skill in the art will appreciate that other configurations of the vias 138 are possible in addition to those illustrated in FIGS. 11A-11C, including, for example, a configuration with three vias per high gap pixel, a configuration in which vias are included for both high gap and mid gap pixels, and/or any other suitable configuration.

Figure 12:
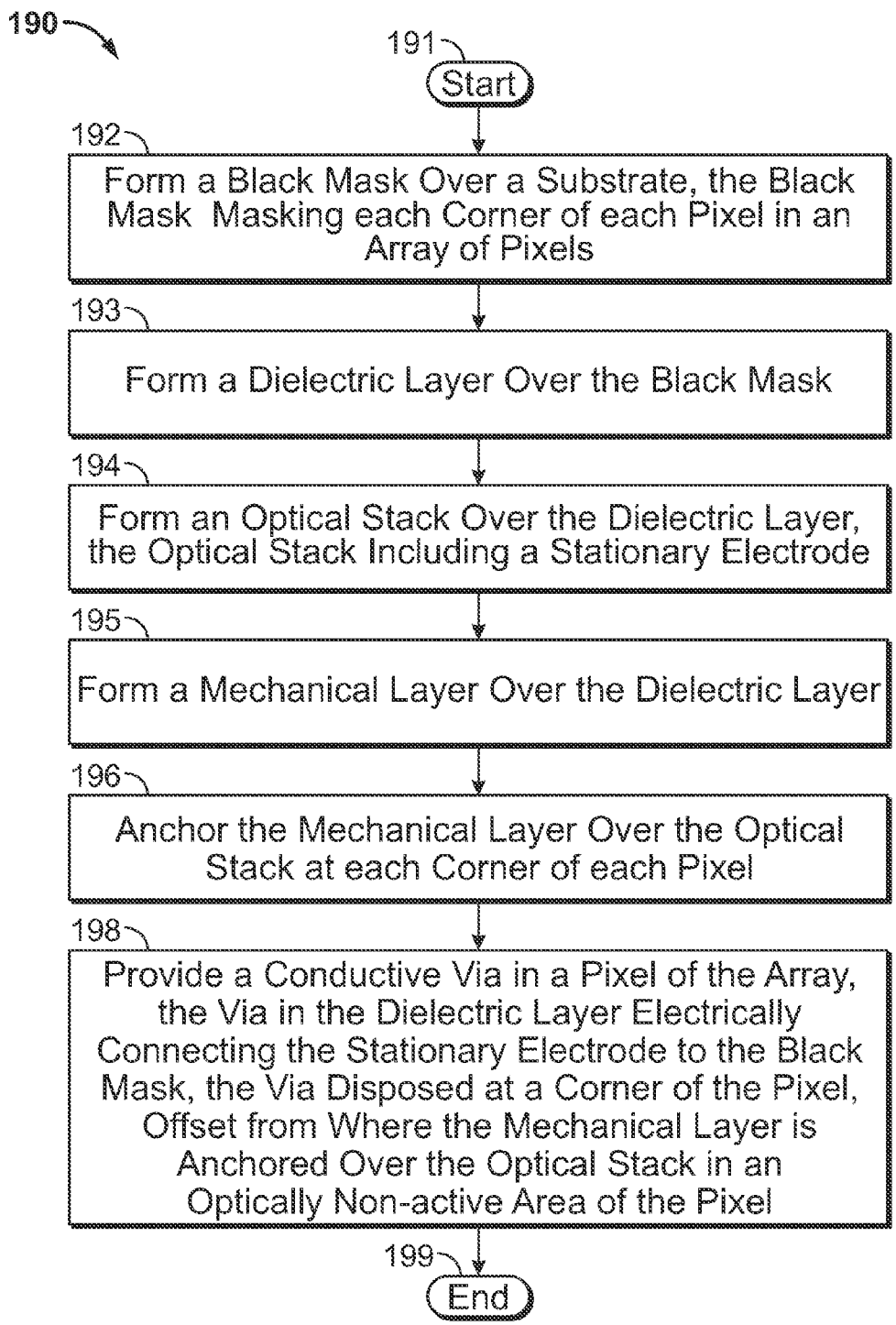
FIG. 12 shows an example of a flow diagram illustrating a manufacturing process for an interferometric modulator.

FIG. 12 shows an example of a flow diagram illustrating a manufacturing process 190 for an interferometric modulator. The process 190 starts at a block 191. In a block 192, a black mask is formed over a substrate. The substrate can be, for example, a transparent substrate, and the black mask structure can be electrically conductive and configured to absorb ambient or stray light in optically inactive pixel regions. The black mask can mask each corner of each pixel in an array of pixels of the interferometric modulator. Additional details of the black mask can be as described above.

In a block 193, a dielectric layer is provided over the black mask. The dielectric layer can be used to electrically isolate the black mask from one or more subsequently deposited layers. The dielectric layer can be any suitable electrical insulator, including, for example, silicon dioxide ($SiO_2$), silicon oxynitride (SiON), and tetraethyl orthosilicate (TEOS). Additional details of the dielectric layer can be as described earlier.

The process 190 illustrated in FIG. 12 continues at a block 194, in which an optical stack is formed over the dielectric layer. As discussed above, the optical stack of an interferometric modulator can be electrically conductive, partially transparent and partially reflective, and can include a stationary electrode for providing the electrostatic operation for the interferometric modulator device.

In a block 195, a mechanical layer is formed over the optical stack. Forming the mechanical layer can include providing a sacrificial layer, depositing one or more layers over the sacrificial layer, and removing the sacrificial layer to release the mechanical layer.

With continuing reference to FIG. 12, the process 190 continues at a block 196, in which the mechanical layer is anchored over the optical stack at each corner of each pixel of the array. For example, a support post can be formed at corners of a pixel and can be used to anchor the mechanical layer over the optical stack at corners of the pixel. However, the mechanical layer can otherwise be anchored, as was described above.

In a block 198, a conductive via is provided in a pixel of the array. The conductive via is in the dielectric layer and electrically connects the stationary electrode to the black mask. The via is disposed at a corner of the pixel, and is offset from where the mechanical layer is anchored over the optical stack in an optically non-active area of the pixel. Offsetting the via relative to where the mechanical layer is anchored at the corner of the pixel can permit the black mask to be smaller compared to a design in which a via and an anchoring region of the mechanical layer overlap. Additional details of the offset via can be as described earlier. The method ends at a block 199.

Figure 13A:
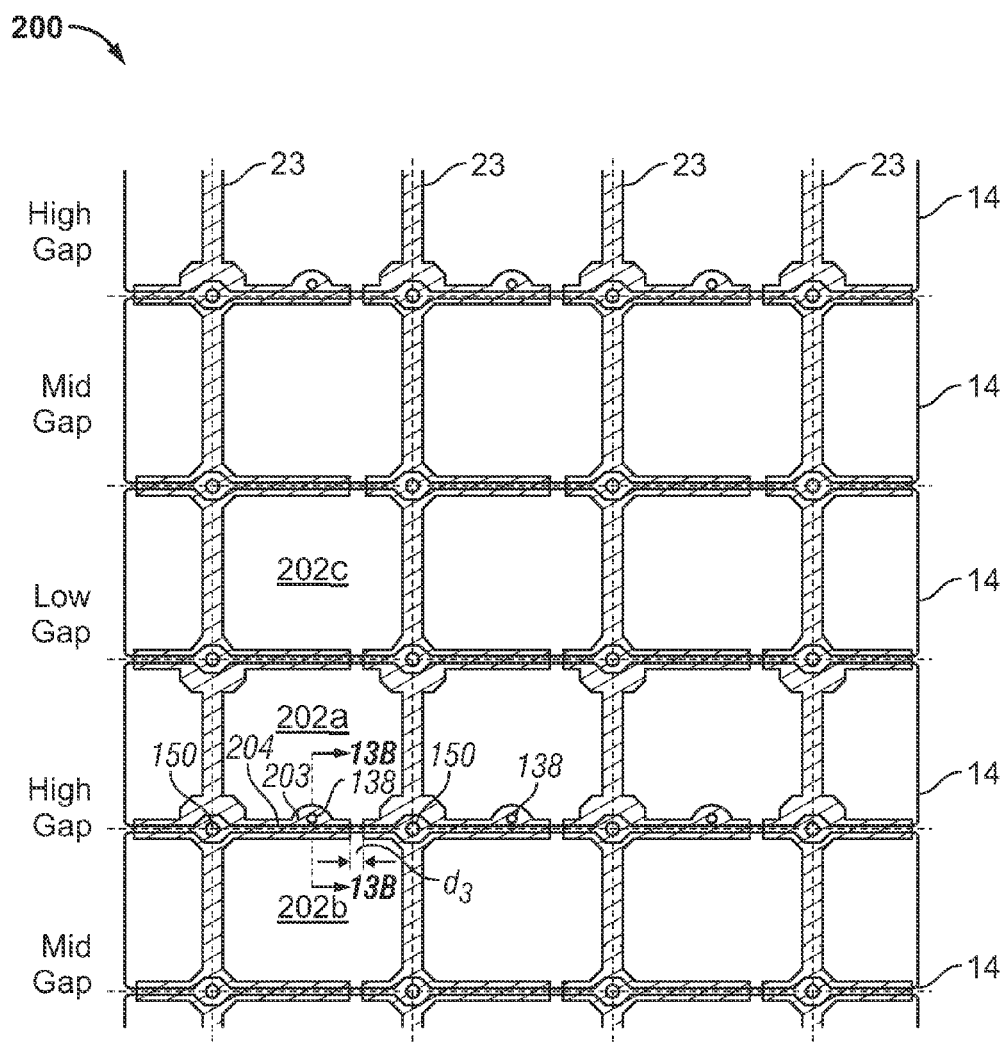
FIG. 13A shows an example of a plan view schematic illustration of an interferometric modulator array.

FIG. 13A shows an example of a plan view schematic illustration of an interferometric modulator array 200. The illustrated interferometric device array 200 includes a first or high gap pixel 202*a*, a second or mid gap pixel 202*b*, a third or low gap pixel 202*c*, a mechanical layer 14, a black mask 23, anchoring holes 150, and vias 138.

Although not illustrated to improve figure clarity, a dielectric layer has been provided over the black mask 23, and an optical stack including a stationary electrode has been provided over the dielectric layer. The vias 138 are used to electrically contact the stationary electrode of the optical stack to various portions of the black mask 23.

The black mask 23 is disposed at corners of each pixel, and along portions of pixel edges. The black mask 23 can be used to provide electrical connections along a row or column, and can include breaks along one or more edges of each pixel to provide the desired electrical connectivity. For example, the black mask 23 includes a break along an edge bordering the high gap pixel 202*a* and the mid gap pixel 202*b*. In some implementations, the breaks have a length $d_3$ in the range of about 2 μm to about 4 μm.

In contrast to the pixel arrays of FIGS. 11A-11C, the pixel array 200 of FIG. 13A includes vias disposed along the edges of pixels. For example, a via 138 has been disposed in the high gap pixel 202*a* in a channel 204 of the black mask 23 along an edge of high gap pixel 202*a* that borders the mid gap pixel 202*b*. As shown in FIG. 13A, vias need not be included at pixel corners in this implementation. Rather, the via 138 can be included along the edge of a pixel, and can be offset from the edge of the pixel in a direction towards the center of the pixel. Providing vias 138 along the edges of pixels in this manner rather than at pixel corners can aid in improving fill factor of the interferometric device array by reducing the area of the black mask used to mask pixel corners.

As shown in FIG. 13A, not all pixel edges need to include a via. For example, as shown in FIG. 13A, vias can be provided only in high gap pixels. In some implementations, vias are included in high gap pixels along edges of the high gap pixels that border mid gap pixels.

The vias 138 can be disposed in channels of the black mask running along pixel edges, and a side of the channel including the via 138 can include a black mask patch or bulge 203 surrounding the footprint of the via 138. By including the bulge 203 in the black mask channel, the vias 138 can become more robust against process variations. For example, the black mask bulge 203 can reduce variation in topology in the area surrounding each via 138, thereby reducing manufacturing errors related to depositing conformal layers over the vias. As shown in FIG. 13A, the vias and bulges can be disposed in high gap pixels. Since high gap pixels can contribute less to reflectance less than low and mid gap pixels, providing a bulge in a high gap pixel can have less impact on brightness relative to a design having a bulge in a mid and/or low gap pixel.

In some implementations, such as the implementation illustrated in FIG. 13A, the via 138 is positioned about halfway along a length of a pixel edge of the high gap pixel 202a. However, the via 138 can be provided in other location along an edge of a pixel. In some implementations, the via 138 is positioned between about ⅓ to about ⅔ along a length of a pixel edge.

Figure 13B:
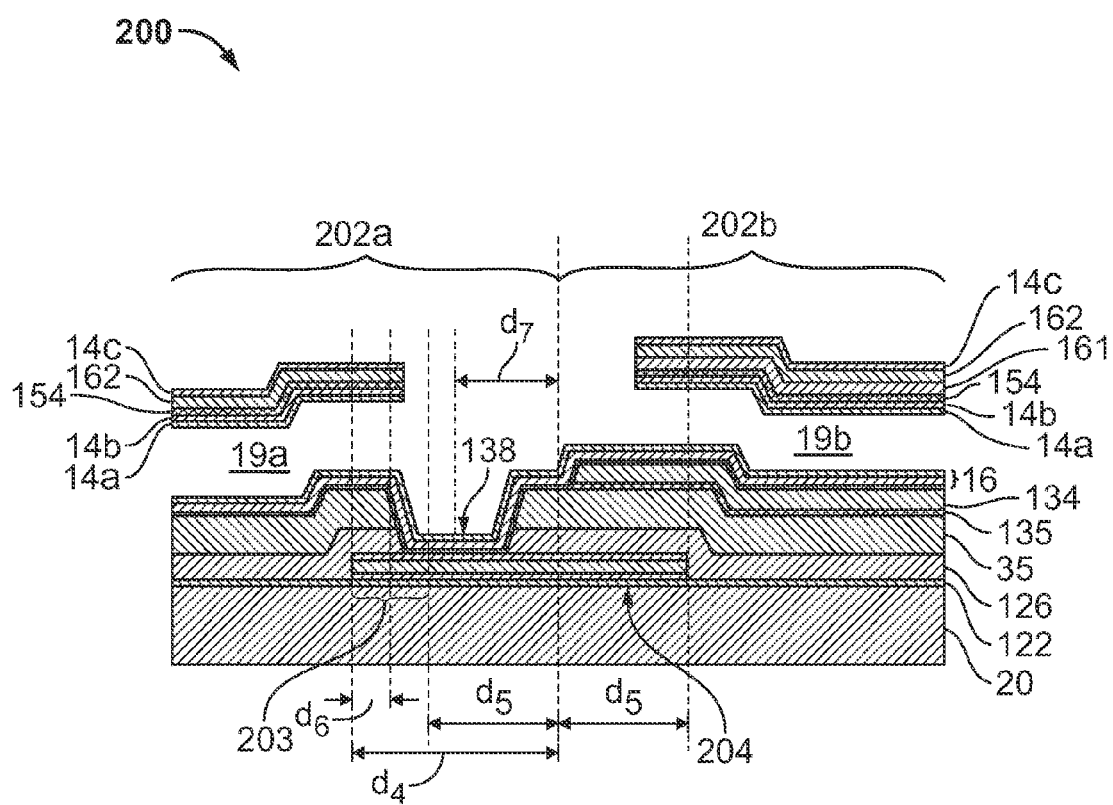
FIG. 13B shows an example of a cross-sectional schematic illustration of the interferometric modulator array of FIG. 13A taken along the line 13B-13B.

FIG. 13B shows an example of a cross-sectional schematic illustration of the interferometric modulator array of FIG. 13A taken along the line 13B-13B. The cross-section includes the high gap pixel 202a, the mid gap pixel 202b, the substrate 20, the black mask channel 204, the black mask bulge 203, the via 138, etch-stop layer 122, the shaping structure 126, the dielectric layer 35, the color enhancement structure 134, the etch-stop layer 135, the optical stack 16, high and mid gaps 19a, 19b, the reflective layer 14a, the support layer 14b, the etch-stop layer 154, the second and third support layers 161, 162, and the cap layer 14c. Additional details of the high and mid gap pixels 202a, 202b can be similar to those described earlier.

In some implementations, the width $d_4$ of the black mask from the edge of the bulge 203 to the edge of the high gap pixel 202a adjacent the mid gap pixel 202b is in the range of about 3 μm to about 4 μm, and the width $d_5$ from the edge of the black mask to the same pixel edge in a region of the black mask not having the bulge 203 is in the range of about 2 μm to about 3 μm. The bulge 203 can have any suitable area. In some implementations in which the bulge is a portion of a circle, the radius of the bulge is in the range of about 3 μm to about 5 μm.

The distance $d_6$ from the edge of via 138 to the edge of the black mask bulge 203 can be selected to reduce variation in topology in the area surrounding the via 138. For example, the vias 138 can cause topology changes in subsequently deposited conformal layers, such as the layers from the optical stack 16 to the cap 14c layer. By increasing the distance $d_6$, variation in topology can be reduced. In some implementations, the distance $d_6$ is selected to be in the range of about 2 μm to about 3 μm. The via 138 can be offset from the edge of the pixel in a direction towards the center of the pixel by any suitable distance. In some implementations, the distance $d_7$ from the center of the via 138 to the edge of the high gap pixel 202a bordering the mid gap pixel 202b is in the range of about 1 μm to about 3 μm.

Figure 14:
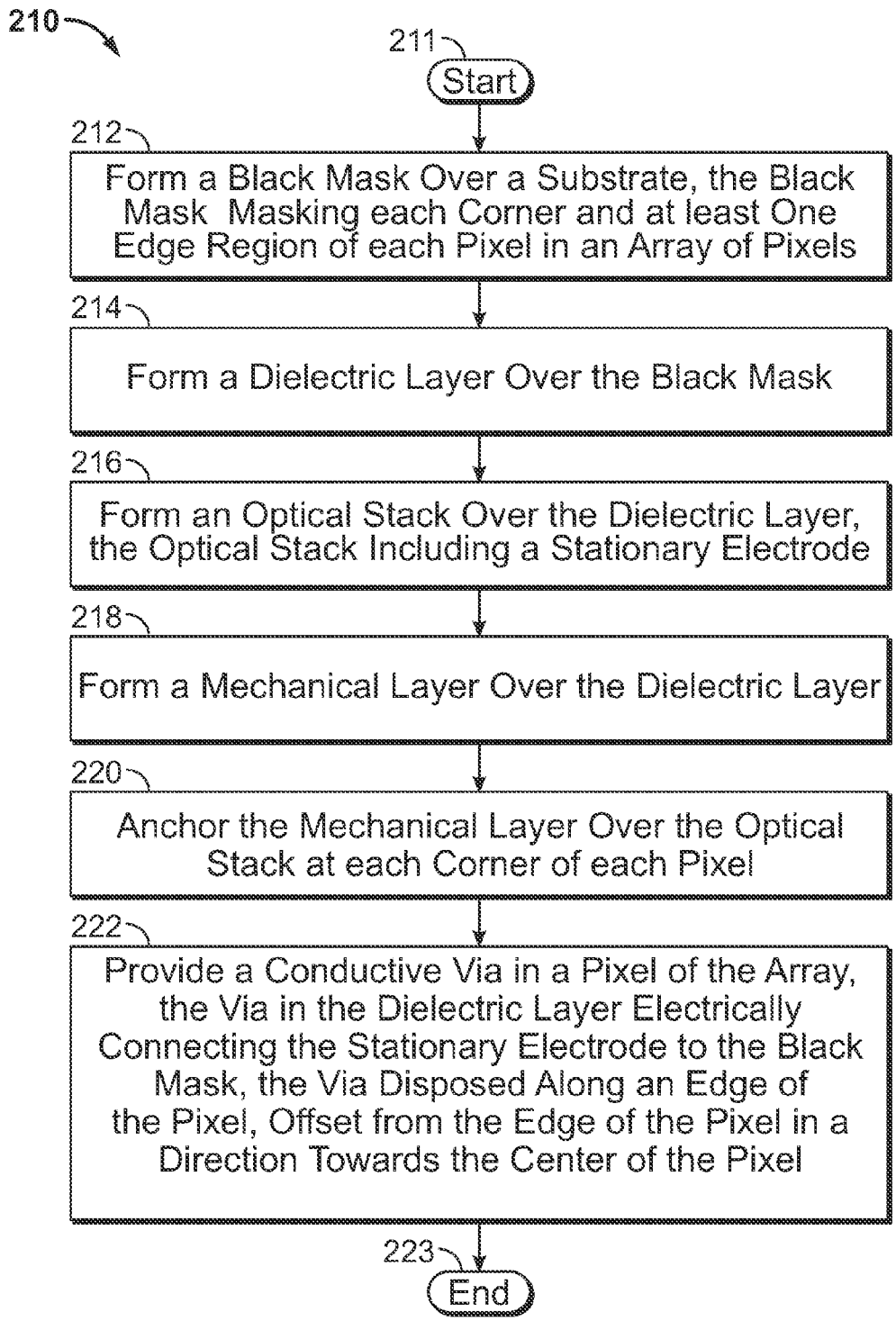
FIG. 14 shows an example of a flow diagram illustrating a manufacturing process for an interferometric modulator.

FIG. 14 shows an example of a flow diagram illustrating a manufacturing process 210 for an interferometric modulator. The process 210 starts at a block 211. In a block 212, a black mask is formed over a substrate. The substrate can be, for example, a transparent substrate, and the black mask structure can be configured to absorb ambient or stray light in optically inactive regions, such as those between pixels, and can be electrically conductive. The black mask can mask each corner and at least one edge region of each pixel in an array of pixels of the interferometric modulator. Additional details of the black mask can be as described earlier.

In a block 214, a dielectric layer is provided over the black mask. The dielectric layer can be used to electrically isolate the black mask from one or more subsequently deposited layers. The dielectric layer can be any suitable electrical insulator, including, for example, silicon dioxide ($SiO_2$), silicon oxynitride (SiON), and tetraethyl orthosilicate (TEOS). Additional details of the dielectric layer can be as described earlier.

With continuing reference to FIG. 14, the process 210 continues at a block 216, in which an optical stack is formed over the dielectric layer. As discussed above, the optical stack of an interferometric modulator can be electrically conductive, partially transparent and partially reflective, and can include a stationary electrode for providing the electrostatic operation for the interferometric modulator device.

In a block 218, a mechanical layer is formed over the optical stack. Forming the mechanical layer can include providing a sacrificial layer, depositing one or more layers over the sacrificial layer, and removing the sacrificial layer to release the mechanical layer.

The process 210 illustrated in FIG. 14 continues at a block 220, in which the mechanical layer is anchored over the optical stack at each corner of each pixel of the array. For example, a support post can be formed at corners of a pixel and can be used to anchor the mechanical layer over the optical stack at corners of the pixel and/or the mechanical layer can be self-supporting, as was described above.

In a block 222, a via is provided in a pixel of the array. The via is disposed in the dielectric layer and electrically connects the stationary electrode to the black mask. The via is disposed along an edge of the pixel and is offset from the edge of the pixel in a direction towards the center of the pixel. In some implementations, the via is formed in a channel of the black mask that extends along the edge of the pixel from a corner of the pixel to another corner of the pixel, and a side of the channel includes a bulge surrounding a footprint of the via. By including the bulge on a side of the black mask channel surrounding the footprint of the via, the via can become more robust against process variations. For example, the bulge can reduce variation in topology in the area surrounding the via, thereby reducing manufacturing errors related to depositing conformal layers over the via. The bulge can be any suitable shape, including, for example, a portion of a circle, hexagon, octagon, rectangle or trapezoid. In some implementations, the bulge can be included on both sides of the channel. The method ends at a block 223.

Figure 15A:
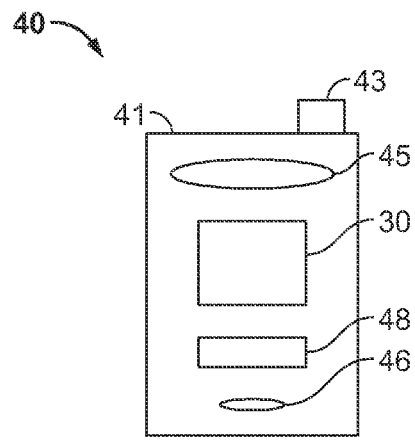
FIGS. 15A and 15B show examples of system block diagrams illustrating a display device that includes a plurality of interferometric modulators.
Figure 15B:
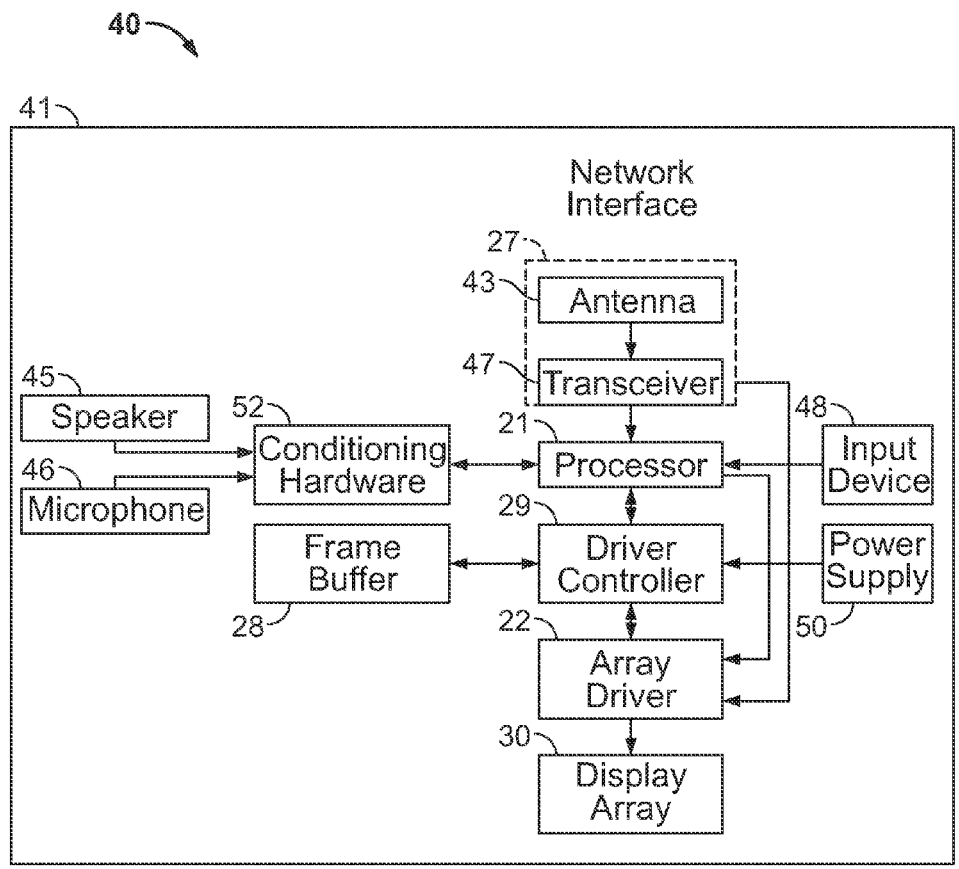

FIGS. 15A and 15B show examples of system block diagrams illustrating a display device 40 that includes a plurality of interferometric modulators. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 15B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components based on the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" or provided as examples is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
   an array of pixels, each pixel having
      a substrate;
      an electrically conductive black mask disposed on the substrate and masking an optically non-active portion of the pixel at each of four corners of the pixel and along at least one edge region of the pixel;
      a dielectric layer disposed over the black mask;
      an optical stack disposed over the dielectric layer, the optical stack including a stationary electrode; and
      a mechanical layer positioned over the optical stack and defining a cavity between the mechanical layer and the optical stack, the mechanical layer movable through the cavity between an actuated position and a relaxed position, the mechanical layer anchored over the optical stack at each corner of the pixel,
      wherein the array of pixels includes a first pixel having a conductive via in the dielectric layer electrically connecting the stationary electrode to the black mask, the conductive via disposed in a position along an edge of the first pixel in an optically non-active area of the first pixel, and wherein the position of the conductive via is spaced offset from the edge of the first pixel in a direction towards the center of the first pixel.

2. The device of claim 1, wherein the array of pixels further includes a second pixel adjacent the first pixel along the edge of the first pixel, wherein the second pixel does not include a via in the dielectric layer for electrically connecting the stationary electrode to the black mask.

3. The device of claim 2, wherein a height of the cavity of the first pixel is greater than a height of the cavity of the second pixel.

4. The device of claim 3, wherein the first pixel is a high gap pixel and the second pixel is a mid gap pixel, and wherein the array of pixels further includes a low gap pixel adjacent the high gap pixel on a side of the high gap pixel opposite the mid gap pixel, and wherein the low gap pixel does not include a via in the dielectric layer for electrically connecting the stationary electrode to the black mask.

5. The device of claim 3, wherein the black mask includes a channel extending from a corner of the pixel to the via along the edge of the first pixel.

6. The device of claim 5, wherein the channel includes a bulge surrounding a footprint of the via.

7. The device of claim 6, wherein a portion of the channel of the black mask including the bulge has a width from an edge of the bulge to the edge of the pixel ranging between about 3 μm to about 4.5 μm.

8. The device of claim 7, wherein a portion of the first channel of the black mask not including the bulge has a width from an edge of the channel of the black mask to the edge of the pixel ranging between about 2 μm to about 3 μm.

9. The device of claim 3, wherein a distance from a center of the via to the edge of the first pixel ranges between about 1 μm to about 3 μm.

10. The device of claim 8, wherein the black mask includes at least one of an optical absorber layer, a dielectric layer, and a conductive bussing layer.

11. The device of claim 10, wherein the via is an opening in the dielectric layer for electrically connecting the conductive bussing layer of the black mask to the stationary electrode of the optical stack.

12. The device of claim 11, further comprising a bias circuit configured to apply a bias voltage, wherein when the bias voltage is applied at least a portion of the mechanical layer is substantially parallel to the substrate.

13. The device of claim 1, further comprising:
a display;
a processor that is configured to communicate with the display, the processor being configured to process image data; and
a memory device that is configured to communicate with the processor.

14. The device of claim 13, further comprising:
a driver circuit configured to send at least one signal to the display; and
a controller configured to send at least a portion of the image data to the driver circuit.

15. The device of claim 14, further comprising an image source module configured to send the image data to the processor.

16. A method of forming a display device having a plurality of pixels, comprising:
depositing an electrically conductive black mask on a substrate, the black mask masking an optically non-active portion of the pixel at each of four corners of each pixel and along at least one edge region of each pixel;
depositing a dielectric layer over the black mask;
depositing an optical stack over the dielectric layer, the optical stack including a stationary electrode;
depositing the mechanical layer over the optical stack, the mechanical layer defining a cavity between the mechanical layer and the optical stack;
anchoring the mechanical layer over the optical stack at each corner of each pixel; and
providing a conductive via in a first pixel of the device, the via disposed in the dielectric layer and electrically connecting the stationary electrode to the black mask, the via disposed in a position along an edge of the first pixel in an optically non-active area of the first pixel, and wherein the position of the conductive via is spaced offset from the edge of the first pixel in a direction towards the center of the first pixel.

17. The method of claim 16, further comprising depositing a sacrificial layer before depositing the mechanical layer and removing the sacrificial layer after depositing the mechanical layer to form the cavity, wherein the sacrificial layer has a thickness selected to define a height of the cavity.

18. The method of claim 17, further comprising forming an anchor hole in the sacrificial layer at each corner of the first pixel, each anchor hole defining where the mechanical layer is anchored over the optical stack at each corner of the first pixel.

19. The method of claim 18, further comprising forming a support post in each anchor hole for supporting the mechanical layer.

20. The method of claim 16, wherein depositing the black mask further includes depositing a channel of the black mask extending from a corner of the pixel to the via along the edge of the first pixel.

21. The method of claim 20, wherein deposing the black mask further includes forming a bulge in the channel surrounding a footprint of the via.

22. The method of claim 16, wherein the first pixel is a high gap pixel, and wherein the plurality of pixels further includes a mid gap pixel adjacent the first pixel along the edge of the first pixel, and wherein the plurality of pixels further includes a low gap pixel adjacent the first pixel opposite the mid gap pixel, wherein the mid gap and low gap pixels do not include a via in the dielectric layer for electrically connecting the stationary electrode to the black mask.

23. The method of claim 16, further comprising forming a reflective layer on a surface of the mechanical layer facing the cavity, the reflective layer and the optical stack forming an interferometric cavity.

24. The method of claim 23, further comprising applying a bias voltage to the optical stack so that at least a portion of the mechanical layer is substantially parallel to the substrate.

25. An electromechanical device comprising:
a plurality of pixels, each pixel including
a substrate;
means for absorbing light disposed on the substrate and masking an optically non-active portion of the pixel at each of four corners of the pixel and along at least one edge region of the pixel;
a dielectric layer disposed over the light absorbing means;
an optical stack disposed over the dielectric layer, the optical stack including a stationary electrode; and
a mechanical layer positioned over the optical stack to define a cavity between the mechanical layer and the optical stack, the mechanical layer movable through the cavity between an actuated position and a relaxed position, the mechanical layer anchored over the optical stack at each corner of the pixel,
wherein the array of pixels includes a first pixel having in the dielectric layer a means for electrically connecting the stationary electrode to the light absorbing means, the connecting means disposed in a position along an edge of the first pixel in an optically non-active area of the first pixel, and wherein the position of the connecting means is spaced offset from the edge of the first pixel in a direction towards the center of the first pixel.

26. The electromechanical device of claim 25, wherein the light absorbing means includes a channel extending from a corner of the pixel to the connecting means along the edge of the first pixel.

27. The electromechanical device of claim 26, wherein the channel includes a bulge surrounding a footprint of the connecting means.

28. The electromechanical device of claim 25, wherein the first pixel is a high gap pixel, and wherein the plurality of pixels further includes a mid gap pixel adjacent the first pixel along the edge of the first pixel, and wherein the plurality of pixels further includes a low gap pixel adjacent the first pixel opposite the mid gap pixel, wherein the mid gap and low gap pixels do not include a means in the dielectric layer for electrically connecting the stationary electrode to the black mask.

* * * * *